United States Patent
Bourstein et al.

(10) Patent No.: US 7,652,516 B2
(45) Date of Patent: Jan. 26, 2010

(54) APPARATUS AND METHOD FOR GENERATING A CLOCK SIGNAL

(75) Inventors: Ido Bourstein, Pardes Hana (IL); Yiftach Banai, Modiin (IL); Gil Stoler, Nofit (IL)

(73) Assignee: Marvell Israel (M.I.S.L.) Ltd. (IL)

( * ) Notice: Subject to any disclaimer, the term of this patent is extended or adjusted under 35 U.S.C. 154(b) by 100 days.

(21) Appl. No.: 11/876,526

(22) Filed: Oct. 22, 2007

(65) Prior Publication Data

US 2008/0094117 A1    Apr. 24, 2008

Related U.S. Application Data

(60) Provisional application No. 60/868,825, filed on Dec. 6, 2006, provisional application No. 60/864,688, filed on Nov. 7, 2006, provisional application No. 60/862,264, filed on Oct. 20, 2006.

(51) Int. Cl.
    *H03K 3/00* (2006.01)
(52) U.S. Cl. ................. 327/291; 327/99; 327/298; 327/299
(58) Field of Classification Search ............... None
    See application file for complete search history.

(56) References Cited

U.S. PATENT DOCUMENTS

| | | | |
|---|---|---|---|
| 5,811,992 A | 9/1998 | D'Souza | |
| 6,087,886 A | 7/2000 | Ko | |
| 6,255,883 B1 | 7/2001 | Delvaux et al. | |
| 6,411,135 B2 * | 6/2002 | Komoto | 327/99 |
| 6,489,825 B1 | 12/2002 | Pasqualini | |
| 6,674,772 B1 | 1/2004 | Dally et al. | |
| 6,690,309 B1 | 2/2004 | James et al. | |
| 6,960,937 B1 | 11/2005 | Nguyen | |
| 6,975,154 B1 * | 12/2005 | Pedersen | 327/295 |
| 6,995,584 B1 | 2/2006 | Nguyen et al. | |
| 7,120,844 B2 * | 10/2006 | Wu | 714/731 |
| 7,126,404 B1 | 10/2006 | Rosen | |
| 7,202,698 B1 | 4/2007 | Bauer et al. | |
| 7,240,266 B2 * | 7/2007 | Farmer et al. | 714/731 |
| 7,259,598 B2 * | 8/2007 | Wu et al. | 327/99 |
| 2004/0196081 A1 | 10/2004 | Srinivasan et al. | |
| 2004/0240274 A1 | 12/2004 | Ku | |
| 2007/0096774 A1 * | 5/2007 | Yang et al. | 327/99 |

OTHER PUBLICATIONS

U.S. Appl. No. 10/614,403, filed Jul. 7, 2003, Rosen.
U.S. Appl. No. 11/093,080, filed Mar. 28, 2005, Rosen et al.

* cited by examiner

*Primary Examiner*—An T Luu
(74) *Attorney, Agent, or Firm*—Brinks Hofer Gilson & Lione

(57) ABSTRACT

A apparatus and method are disclosed for generating one or more clock signals. A clock signal is generated based on pattern signals and a reference clock signal. When the reference clock signal transitions high, the state of a first pattern signal is output, and when the reference clock signal transitions low, the state of a second pattern signal is output. Successive states of the first and second pattern signals, selected according to the reference clock signal, provide the generated clock signal.

25 Claims, 10 Drawing Sheets

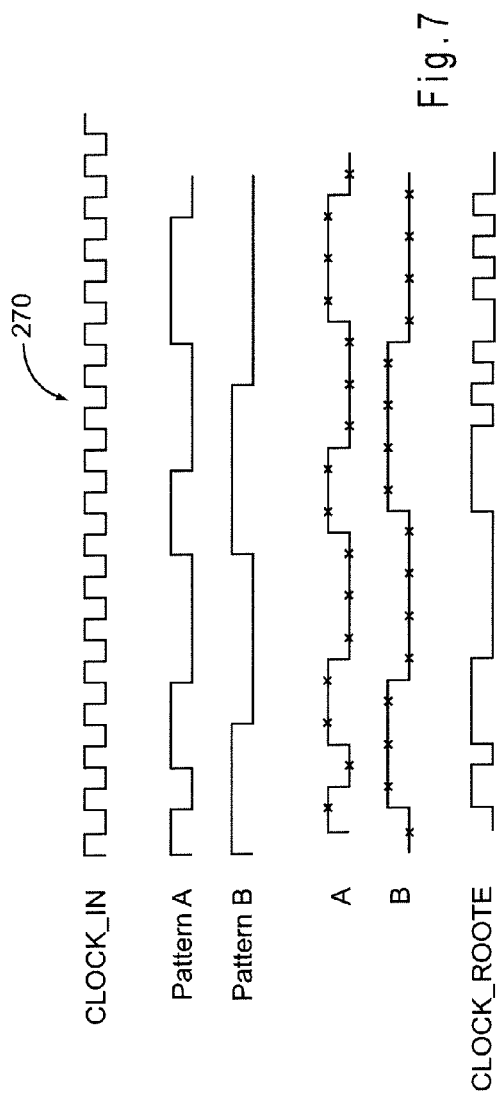
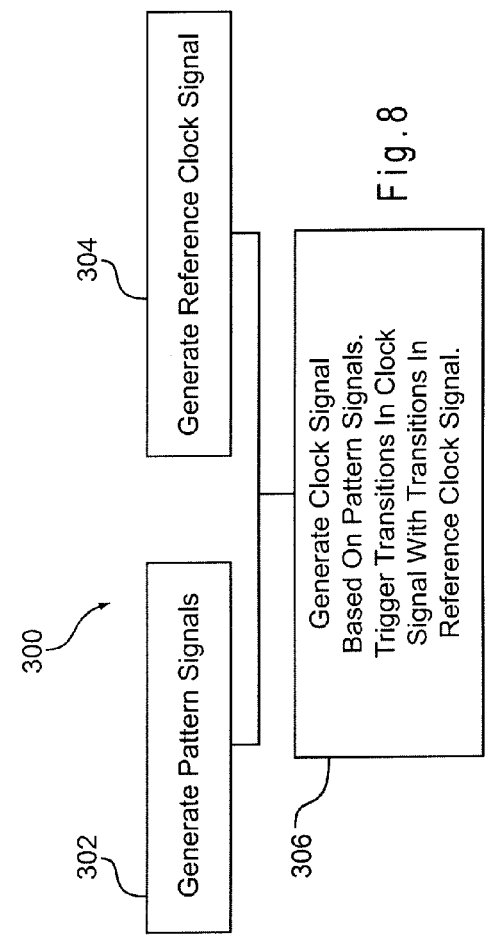

APPARATUS AND METHOD FOR GENERATING A CLOCK SIGNAL

RELATED APPLICATION

This application claims the benefit of U.S. Provisional Application No. 60/862,264, filed on Oct. 20, 2006, 60/864,688, filed on Nov. 7, 2006, and 60/868,825, filed on Dec. 6, 2006, all of which are incorporated herein by reference.

COPYRIGHT NOTICE

The appendix of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Technical Field

The present disclosure relates to the field of clock signal generation, and more particularly to the generation of multiple phase-aligned clock signals.

2. Related Art

In an ideal synchronous circuit, all data transitions occur simultaneously and all components are synchronized by one or more related clock signals. Multiple clock signals are often used in a circuit because circuit components are designed to function (reliably) at different speeds. For example, a central processing unit (CPU) typically functions at a much higher speed than a peripheral/external interface data bus. It is important, however, that the frequency of the clock signal that drives the CPU be a multiple of the frequency of the clock signal that drives the data bus so that data bus operations are in synchronization with the operation of the CPU. For example, a CPU may function at 3 GHz and the system bus may function at 375 MHz, a ratio of 1:8. Operations that involve both the CPU and the data bus will succeed only if (1) the CPU and data bus clock signals maintain the 1:8 ratio and (2) each data bus clock signal transition occurs at the same time with respect to eight CPU clock signals, i.e., the CPU and data bus clock signals are phase-aligned.

High speed components and increasingly complex circuits have made it difficult to phase-align the different clock signals in a circuit. In addition, some circuits require three, four, or even more different clock signals, all of which must be phase-aligned. In such circuits, phase-alignment is partially aided by having all of the clock circuits (also referred to as clock dividers) derive their clock signals (also referred to as clock root signals) from a common signal, typically generated by a phase-locked loop (PLL) system. The PLL system, in turn, is driven by a chip's reference clock oscillator. Thus, all clock root signals are derived, either directly or indirectly, from a common reference clock oscillator.

One of the factors that determines the complexity of the clock dividers is the number of different clock root signals that must be phase-aligned. The greater the number of clock root signals, the less forgiving each clock divider can be to clock signal effects such as skew, jitter, and noise. Stability, predictability, and variance parameters of clock dividers are becoming increasingly stringent due to circuit designs that utilize high speed components and multiple clock root signals.

One technique for generating phase-aligned clock root signals is to "merge" the clock dividers into the PLL system design. However, this design approach typically involves highly sensitive analog and digital design considerations and leads to difficult verification and qualification processes.

Another technique for generating phase-aligned clock root signals is to provide the PLL system output to a series of cascaded multiplexer circuits, and have each multiplexer provide a different clock root signal. However, this design approach leads to long signal paths of varying lengths and, consequently, high jitter. It also requires large timing margins. An improved approach is desirable.

BRIEF SUMMARY

The following embodiments relate to systems and methods of generating a clock signal, wherein the structure of a generated clock signal in relation to a reference clock signal is determined by two signal patterns ("patterns") input into a pattern selector. The pattern selector, a pattern generator, and a reference clock signal generator may be referred to collectively as a clock signal generator. In a system that requires more than one clock signal, multiple, equivalent pattern selectors can be implemented for generating each clock signal. The patterns input into the pattern selectors, not the circuit structures of the clock signal generators, determines the structure of each generated clock signal. Thus, skew from the reference clock signal to the generated clock signal is primarily the same for each pattern selector so that the different clock signals are readily synchronized.

The systems and methods of the following embodiments may be used to generate clock signals that have fifty-percent duty cycles or non-fifty-percent duty cycles. The generated clock signals may be synchronous or asynchronous. In all cases, a generated clock signal is characterized by phase alignment between its edges and the edges of the reference clock signal.

The clock signal generators may generate clock signals that serve functional, power saving, testing, and/or other operational modes, for example. Although the patterns may be different for generating the clock signals for each mode, the pattern selectors are identical. In one version, the clock signal generators are not subject to narrow timing constraints because the pattern selector synchronizes the patterns to the reference clock signal. On chips having multiple clocks, several clock signals, each having a different structure/ratio, may all be synchronized to a single reference clock in the sense that the phases of the different clock signals are aligned.

An embodiment of a pattern selector includes a first storage element having a first input to receive a first signal pattern and a second storage element having a second input to receive a second signal pattern. The first and second storage elements may be D flip-flops, as examples. The pattern selector has a switching element, such as a multiplexer, to receive latched states of the first storage element at a first data input and the second storage element at a second data input. The switching element selects states of the first storage element output and the second storage element output in an alternating sequence coincident with high and low transitions, respectfully, of the reference clock signal. The first storage element, the second storage element, and the switching element are clocked with the reference clock signal, such as one generated by a PLL system, for example. The switching element outputs the generated clock signal. The switching element may be a time-balanced multiplexer such that the delay between rising or falling edges of the reference clock signal to the rising or falling edges of the corresponding generated clock signal are substantially equal.

The clock signal generator may include a pattern generator to generate and modify the first signal pattern and the second signal pattern.

A method includes receiving a first signal pattern, a second signal pattern, and a first clock signal, storing a first state of the first signal pattern at a first transition in the first clock signal, and storing a second state of the second signal pattern at a second transition in the first clock signal. The method may include generating a second clock signal by selecting the first state when the first clock signal is high and selecting the second state when the first clock signal is low. The first and second signal patterns may be modified. The method may include generating the first and second signal patterns for an AC scan test. The first and second signal patterns may be provided based on a target ratio of the second clock signal to the first clock signal.

An apparatus comprises one or more of the following: means for receiving a first signal pattern, a second signal pattern, and a first clock signal; means for storing a first state of the first signal pattern at a first transition in the first clock signal; means for storing a second state of the second signal pattern at a second transition in the first clock signal; means for generating a second clock signal by selecting the first state when the first clock signal is high and selecting the second state when the first clock signal is low; means for modifying the first and second signal patterns; means for generating the first and second signal patterns for an AC scan test; means for increasing the strength of the second clock signal; and means for providing the first and second signal patterns based on a target ratio of the second clock signal to the first clock signal.

A computer readable storage medium has processor executable instructions to execute one or more of the following acts: receive a first signal pattern, a second signal pattern, and a first clock signal; store a first state of the first signal pattern at a first transition in the first clock signal; store a second state of the second signal pattern at a second transition in the first clock signal; generate a second clock signal by selecting the first state when the first clock signal is high and selecting the second state when the first clock signal is low; modify the first and second signal patterns; generate the first and second signal patterns for an AC scan test; and select the first and second signal patterns based on a target ratio of the second clock signal to the first clock signal. The direction of the first transition may be opposite the direction of the second transition.

An apparatus comprises a switching element, such as a multiplexer, to receive a first clock signal that alternates between a high state and a low state, a first input signal, and a second input signal. The switching element outputs a second clock signal having a first state that is determined by the first input signal when the first clock signal is low, and a second state that is determined by the second input signal when the first clock signal is high. A device having a clock input may receive the second clock signal. The apparatus may have a first storage element to communicate the first input signal to the switching element, wherein the first storage element is clocked by the first clock signal. The first storage element may be a memory element that receives a low pattern signal. The apparatus may have a second storage element to communicate the second input signal to the switching element, wherein the second storage element is clocked by the first clock signal. The second storage element may be a memory element that receives a high pattern signal. A signal generator may generate the first and second input signals to provide the second clock signal, wherein consecutive periods of the first state are equal and/or a period of the second clock signal is an integer multiple of a period of the first clock signal.

A method includes receiving a first clock signal that alternates between a high state and a low state, a first input signal, and a second input signal. A second clock signal is communicated to a clock input of a device, wherein the second clock signal has a first state that is determined by the first input signal when the first clock signal is low, and a second state that is determined by the second input signal when the first clock signal is high. The first input signal may be communicated to a switching element in accord with the first clock signal. A low pattern signal may be communicated to a first storage element in communication with the switching element. The second input signal may be communicated to the switching element in accord with the first clock signal. A high pattern signal may be communicated to a second storage element in communication with the switching element. Transitions in the second clock signal may be synchronized to transitions in the first clock signal. The first and second input signals may be generated to provide the second clock signal, wherein consecutive periods of the first state are equal and/or a period of the second clock signal is an integer multiple of a period of the first clock signal.

A apparatus comprises one or more of the following: means for receiving a first clock signal that alternates between a high state and a low state, a first input signal, and a second input signal; means for communicating a second clock signal to a clock input of a device, wherein the second clock signal has a first state that is determined by the first input signal when the first clock signal is low, and a second state that is determined by the second input signal when the first clock signal is high; means for communicating the first input signal to a switching element in accord with the first clock signal; means for communicating a low pattern signal to a first storage element in communication with the switching element; means for communicating the second input signal to the switching element in accord with the first clock signal; means for communicating a high pattern signal to a second storage element in communication with the switching element; means for synchronizing transitions in the second clock signal to transitions in the first clock signal; and means for generating the first and second input signals to provide the second clock signal.

A computer readable storage medium has processor executable instructions to execute one or more of the following acts: receive a first clock signal that alternates between a high state and a low state, a first input signal, and a second input signal; communicate a second clock signal to a clock input of a device, wherein the second clock signal has a first state that is determined by the first input signal when the first clock signal is low, and a second state that is determined by the second input signal when the first clock signal is high; communicate the first input signal to a switching element in accord with the first clock signal; communicate a low pattern signal to a first storage element in communication with the switching element; communicate the second input signal to the switching element in accord with the first clock signal; communicate a high pattern signal to a second storage element in communication with the switching element; synchronize transitions in the second clock signal to transitions in the first clock signal; generate the first and second input signals to provide the second clock signal, wherein consecutive periods of the first state are equal and/or a period of the second clock signal is an integer multiple of a period of the first clock signal.

A system comprises a reference clock outputting a reference clock signal having a first frequency, a first clock signal generating circuitry that receives the reference clock signal, and that employs first multiplexer circuitry which uses the reference clock signal and first clock defining data to output a first clock signal that is related to the reference clock signal. The system includes a second clock signal generating circuitry that receives the reference clock signal, and that employs second multiplexer circuitry which uses the reference clock signal and second clock defining data to output a second clock signal that is related to the reference clock signal and has a different frequency than the first clock signal. A first device may receive the first clock signal and a second device may receive the second clock signal. Both the first and second multiplexer circuitries may be configured to output the respective first and second clock signals, both having the following characteristics: a rise time that is substantially equal to a reference clock signal rise time and a reference clock signal fall time, and a fall time that is substantially equal to the reference clock signal rise time and the reference clock signal fall time. The first clock signal and the second clock signal may be substantially in mutual phase alignment.

A method comprises generating a first clock signal based on a reference clock signal and first clock defining data, generating a second clock signal based on the reference clock signal and second clock defining data. The second clock signal has a different frequency than the first clock signal. The first clock signal may be communicated to a first device and the second clock signal may be communicated to a second device. The first and second clock signals may both have the following characteristics: a rise time that is substantially equal to a reference clock signal rise time and a reference clock signal fall time, and a fall time that is substantially equal to the reference clock signal rise time and the reference clock signal fall time. The first clock signal and the second clock signal may be substantially in mutual phase alignment.

A system comprises one or more or the following: means for generating a first clock signal based on a reference clock signal and first clock defining data; means for generating a second clock signal based on the reference clock signal and second clock defining data; and/or means for communicating the first clock signal to a first device and the second clock signal to a second device. The second clock signal may have a different frequency than the first clock signal. The first and second clock signals may both have the following characteristics: a rise time that is substantially equal to a reference clock signal rise time and a reference clock signal fall time, and a fall time that is substantially equal to the reference clock signal rise time and the reference clock signal fall time. The first clock signal and the second clock signal may be substantially in mutual phase alignment.

A computer readable storage medium has processor executable instructions to execute one or more of the following acts: generate a first clock signal based on a reference clock signal and first clock defining data; generate a second clock signal based on the reference clock signal and second clock defining data; and communicate the first clock signal to a first device and the second clock signal to a second device. The second clock signal may have a different frequency than the first clock signal. The first and second clock signals may both have the following characteristics: a rise time that is substantially equal to a reference clock signal rise time and a reference clock signal fall time, and a fall time that is substantially equal to the reference clock signal rise time and the reference clock signal fall time. The first clock signal and the second clock signal may be substantially in mutual phase alignment.

An apparatus comprises a first storage element having a first input to receive a first signal pattern, a second storage element having a second input to receive a second signal pattern, and a switching element to receive a first output of the first storage element and a second output of the second storage element. The first storage element, the second storage element, and the switching element are clocked by a first clock signal, and the switching element outputs a second clock signal. The apparatus may include a pattern generator to generate the first signal pattern and the second signal pattern and modify the first and second signal patterns to modify the second clock signal. The ratio of the first clock signal to the second clock signal may be based on the first and second signal pattern.

A method comprises receiving a first signal pattern, a second signal pattern, and a first clock signal, and storing a first state of the first signal pattern at a first transition in the first clock signal, and storing a second state of the second signal pattern at a second transition in the first clock signal. A second clock signal is generated by selecting the first state when the first clock signal is high and selecting the second state when the first clock signal is low. The method may include generating the first signal pattern and the second signal pattern with a pattern generator that may modify the first and second signal patterns to modify the second clock signal. The ratio of the first clock signal to the second clock signal may be based on the first and second signal patterns.

An apparatus comprises one or more of the following: means for receiving a first signal pattern, a second signal pattern, and a first clock signal; means for storing a first state of the first signal pattern at a first transition in the first clock signal and storing a second state of the second signal pattern at a second transition in the first clock signal; means for generating a second clock signal by selecting the first state when the first clock signal is high and selecting the second state when the first clock signal is low; and means for modifying the first and second signal patterns to modify the second clock signal.

A computer readable storage medium has processor executable instructions to execute one or more of the following acts: receive a first signal pattern, a second signal pattern, and a first clock signal, and store a first state of the first signal pattern at a first transition in the first clock signal, and store a second state of the second signal pattern at a second transition in the first clock signal; generate a second clock signal by selecting the first state when the first clock signal is high and selecting the second state when the first clock signal is low; generate the first signal pattern and the second signal pattern with a pattern generator that may modify the first and second signal patterns to modify the second clock signal. The ratio of the first clock signal to the second clock signal may be based on the first and second signal patterns.

An apparatus comprises a first clock signal generator to generate a first clock signal having a first ratio to a reference clock signal, and a second clock signal generator to generate a second clock signal having a second ratio to the reference clock signal. The first ratio is based on a first signal pattern and the second ratio is based on a second signal pattern. The first clock signal generator is equivalent in structure to the second clock signal generator. The first and second clock signal generators are clocked by the reference clock signal. The apparatus may also include a first multiplexer to provide the first clock signal and a second multiplexer to provide the second clock signal. The first and second multiplexers may be clocked by the reference clock signal.

A method includes generating a first clock signal having a first ratio to a reference clock signal and a second clock signal having a second ratio to the reference clock signal. The first ratio is based on a first signal pattern and the second ratio is based on a second signal pattern. The method may include clocking first and second clock signal generators with the reference clock signal.

An apparatus comprises a first clock signal generator to generate a first clock signal having a first ratio to a reference clock signal, and a second clock signal generator to generate a second clock signal having a second ratio to the reference clock signal. The first ratio is based on a first signal pattern and the second ratio is based on a second signal pattern. The first clock signal generator is equivalent in structure to the second clock signal generator, and the first and second clock signal generators are clocked by the reference clock signal. The apparatus may include a first multiplexer to provide the first clock signal and a second multiplexer to provide the second clock signal. The first and second multiplexers may be clocked by the reference clock signal. A first storage element, clocked by the reference clock signal, may receive the first signal pattern and communicate a first data sample to the first multiplexer. A second storage element, clocked by the reference clock signal, may receive the second signal pattern and communicate a second data sample to the second multiplexer. The apparatus may also include a third storage element, clocked by the reference clock signal, to receive a third signal pattern and communicate a third data sample to the first multiplexer, and a fourth storage element, clocked by the reference clock signal, to receive a fourth signal pattern and communicate a fourth data sample to the second multiplexer. The first and second storage elements may receive the reference clock signal at inverted clock inputs, and the third and fourth storage elements may receive the reference clock signal at un-inverted clock inputs. The apparatus may also include a first pattern generator to generate the first and third signal patterns and a second pattern generator to generate the second and fourth signal patterns. The first pattern generator may modify the first and third signal patterns to change the first ratio. The first and second storage elements may be D flip-flops, as an example. The first clock signal may be a processor clock root signal and the second clock signal may be a data bus clock root signal, as examples.

A method includes generating a first clock signal based upon a first pattern signal and a second pattern signal, and generating a second clock signal based upon a third pattern signal and a fourth pattern signal. The method includes synchronizing the first clock signal and the second clock signal. The method may also include selecting the first pattern signal and the second pattern signal based upon a first target ratio of the first clock signal to the reference clock signal, and selecting the third pattern signal and the fourth pattern signal based upon a second target ratio of the second clock signal to the reference clock signal. The first pattern signal and the third pattern signal may be sampled when the reference clock signal transitions from high to low, and the second pattern signal and the fourth pattern signal may be sampled when the reference clock signal transitions from low to high. The method may include selecting samples of the first pattern signal and samples of the third pattern signal when the reference clock signal is high, and selecting samples of the second pattern signal and samples of the fourth pattern signal when the reference clock signal is low. The first clock signal consists of samples of the first pattern signal and the second pattern signal, and the second clock signal consists of samples of the third pattern signal and the fourth pattern signal.

An apparatus comprises one or more of the following: means for generating a first clock signal based upon a first pattern signal and a second pattern signal; means for generating a second clock signal based upon a third pattern signal and a fourth pattern signal; means for synchronizing the first clock signal and the second clock signal; means for providing the first pattern signal and the second pattern signal based upon a first target ratio of the first clock signal to the reference clock signal; means for providing the third pattern signal and the fourth pattern signal based upon a second target ratio of the second clock signal to the reference clock signal; means for sampling the first pattern signal and the third pattern signal when the reference clock signal transitions from high to low; means for sampling the second pattern signal and the fourth pattern signal when the reference clock signal transitions from low to high; means for selecting samples of the first pattern signal and samples of the third pattern signal when the reference clock signal is high; and means for selecting samples of the second pattern signal and samples of the fourth pattern signal when the reference clock signal is low.

A computer readable storage medium has processor executable instructions to execute one or more of the following acts: generate a first clock signal based upon a first pattern signal and a second pattern signal; generate a second clock signal based upon a third pattern signal and a fourth pattern signal; synchronize the first clock signal and the second clock signal; select the first pattern signal and the second pattern signal based upon a first target ratio of the first clock signal to the reference clock signal; select the third pattern signal and the fourth pattern signal based upon a second target ratio of the second clock signal to the reference clock signal; sample the first pattern signal and the third pattern signal when the reference clock signal transitions from high to low; sample the second pattern signal and the fourth pattern signal when the reference clock signal transitions from low to high; select samples of the first pattern signal and samples of the third pattern signal when the reference clock signal is high; and select samples of the second pattern signal and samples of the fourth pattern signal when the reference clock signal is low. The first clock signal may consist of samples of the first pattern signal and the second pattern signal, and the second clock signal may consist of samples of the third pattern signal and the fourth pattern signal.

Other systems, methods, and features of the invention will be, or will become, apparent to one with skill in the art upon examination of the following figures and detailed description. It is intended that all such additional systems, methods, features and advantages be included within this description, be within the scope of the invention, and be protected by the following claims.

The embodiments will now be described with reference to the attached drawings.

BRIEF DESCRIPTION OF THE DRAWINGS

FIG. 7 is a timing diagram of the circuit of FIG. 2 showing input patterns for generating an asymmetric clock root signal;

FIG. 8 shows acts for generating a clock signal in accord with a version of the present invention;

FIG. 11(*b*) is a functional block diagram of a digital versatile disk (DVD);

FIG. 11(*c*) is a functional block diagram of a high definition television;

FIG. 11(*d*) is a functional block diagram of a vehicle control system;

FIG. 11(*e*) is a functional block diagram of a cellular phone;

FIG. 11(*f*) is a functional block diagram of a set top box;

FIG. 11(*g*) is a functional block diagram of a media player; and

FIG. 11(*h*) is a functional block diagram of a VoIP phone.

DETAILED DESCRIPTION OF THE PRESENTLY PREFERRED EMBODIMENTS

Figure 1:
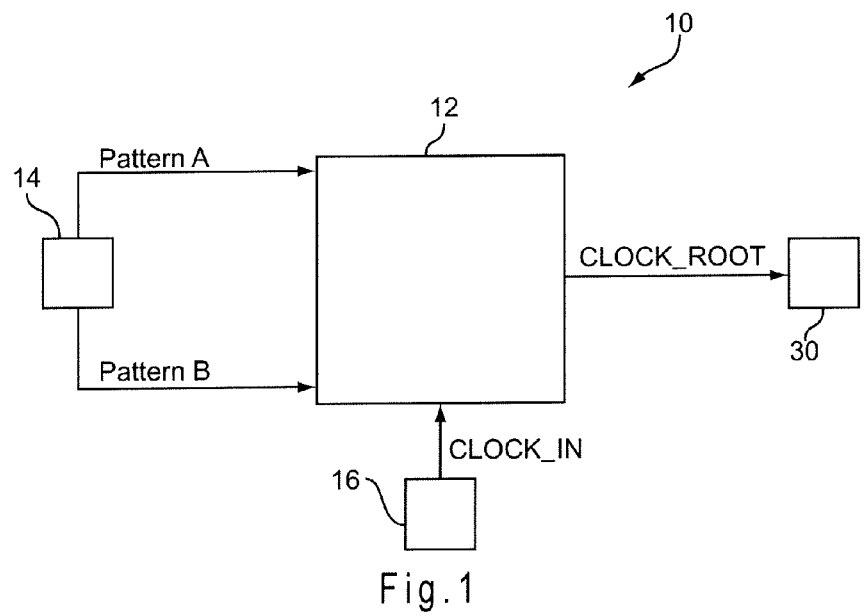
FIG. 1 is an illustration of a system that includes a clock signal generator according to an embodiment of the present invention.

The disclosure can be better understood with reference to the following drawings and description. The components in the figures are not necessarily to scale, emphasis instead being placed upon illustrating the principles of the invention. Moreover, in the figures, like reference numerals designate corresponding parts or elements throughout the different views.

The embodiments below relate to a clock signal generator having a signal path that is consistent regardless of the ratio of the generated clock signal frequency to a reference clock signal frequency. Thus, substantially identical circuits, all driven by the same reference clock signal (provided by a system reference clock, for example), may be used to generate clock signals of different frequencies and symmetries/asymmetries. For each clock signal generator, the ratio of the generated clock signal frequency to the reference clock signal frequency is controlled by patterns generated by a pattern generator. Different patterns, or sets of patterns, govern different clock signal frequencies (i.e., ratios to the reference clock signal) and/or symmetries/asymmetries. For generating a clock signal, a pattern selector is sensitive to transitions in the reference clock signal. The pattern selector receives the patterns and outputs the state of a first pattern when the reference clock signal transitions high, and outputs the state of a second pattern when the reference clock signal transitions low. Thus, the form of the clock signal generated by the clock signal generator is based on the patterns generated by the pattern generator.

FIG. 1 is an illustration of a system having a clock signal generator 10 that includes a pattern selector 12. The pattern selector 12 receives an input clock signal (referred to as CLOCK-IN), a high pattern signal (referred to as Pattern A) and a low pattern signal (referred to as Pattern B) and outputs a clock signal (referred to as CLOCK_ROOT). The CLOCK_ROOT signal is communicated to the clock input pin of a device 30. The device 30 may be any device, memory component, system, or circuit that is on a chip, or other device that receives a clock signal.

A clock source 16 provides the CLOCK_IN signal and a pattern generator 14 provides the Pattern A and Pattern B signals. In one version, the clock source 16 is a phase locked loop (PLL) circuit that receives a system clock signal generated by a reference clock oscillator (not shown). The pattern generator 14 may be any type of signal generator and preferably generates Pattern A and Pattern B signals that are synchronized to the CLOCK_IN signal generated by the clock source 16. In another version, the Pattern A and Pattern B signals are not necessarily in synchronization with the CLOCK_IN signal; in this version synchronization between the CLOCK_IN signal and the Pattern A and Pattern B signals may be achieved by the pattern selector 12, as explained below. The pattern selector 12 may include a switching element such as a multiplexer and/or other device.

The CLOCK_IN signal is a periodic signal that oscillates between low and high states at a reference clock frequency. In one version, the CLOCK_IN signal is a generally square waveform (having finite rise and fall times that are non-instantaneous, resulting in a slight slope) generated by the clock source 16. The Pattern A and Pattern B signals generated by the pattern generator 14 determine the state (high or low) of the CLOCK_ROOT signal when the CLOCK_IN signal transitions high and low, respectively. In other words, when the CLOCK_IN signal transitions high, the pattern selector 12 outputs the state of Pattern A, and when the CLOCK_IN signal transitions low, the pattern selector 12 outputs the state of Pattern B. The Pattern A and Pattern B signals may be referred to as "envelopes" applied to the CLOCK_IN signal to generate the CLOCK_ROOT signal.

The CLOCK_ROOT signal has transitions that are phase-aligned to the transitions of the CLOCK_IN signal. There is a constant and uniform delay between CLOCK_IN transitions, and the transitions in the output CLOCK_ROOT signal. Because the transitions of the CLOCK_ROOT signal are triggered by the CLOCK_IN signal, the resolution of the CLOCK_ROOT signal is determined by the CLOCK_IN signal. In one version, the CLOCK_IN signal is a high frequency signal compared to the Pattern A and Pattern B signals.

Table 1 is a logic map for a pattern selector 12 showing an example of the state of the signals discussed above.

TABLE 1

Logic Map for Pattern Selector

| Signal | Signal State | | | | | | | |
|---|---|---|---|---|---|---|---|---|
| CLOCK_IN | Rise | Rise | Rise | Rise | Fall | Fall | Fall | Fall |
| Pattern A | High | High | Low | Low | High | High | Low | Low |
| Pattern B | High | Low | High | Low | High | Low | High | Low |
| CLOCK_ROOT | High | High | Low | Low | High | Low | High | Low |

Table 1 illustrates that when the CLOCK_IN signal transitions high (rises), the CLOCK_ROOT signal follows Pattern A (which therefore may be referred to as the "high pattern"). When the CLOCK_IN signal transitions low (falls), the CLOCK_ROOT signal follows Pattern B (which therefore may be referred to as the "low pattern"). The pattern generator 14 may be a single device that generates both Pattern A and Pattern B. In an alternate version, Pattern A and Pattern B are generated by two signal generators; one for each pattern. In the example above, the pattern generator that generates Pattern A may be referred to as a "high signal" pattern generator (although it should be understood that pattern A includes both high and low signal states), and the pattern generator that generates Pattern B may be referred to as a "low signal" pattern generator (although it should be understood that pattern B includes both high and low signal states).

Figure 2:
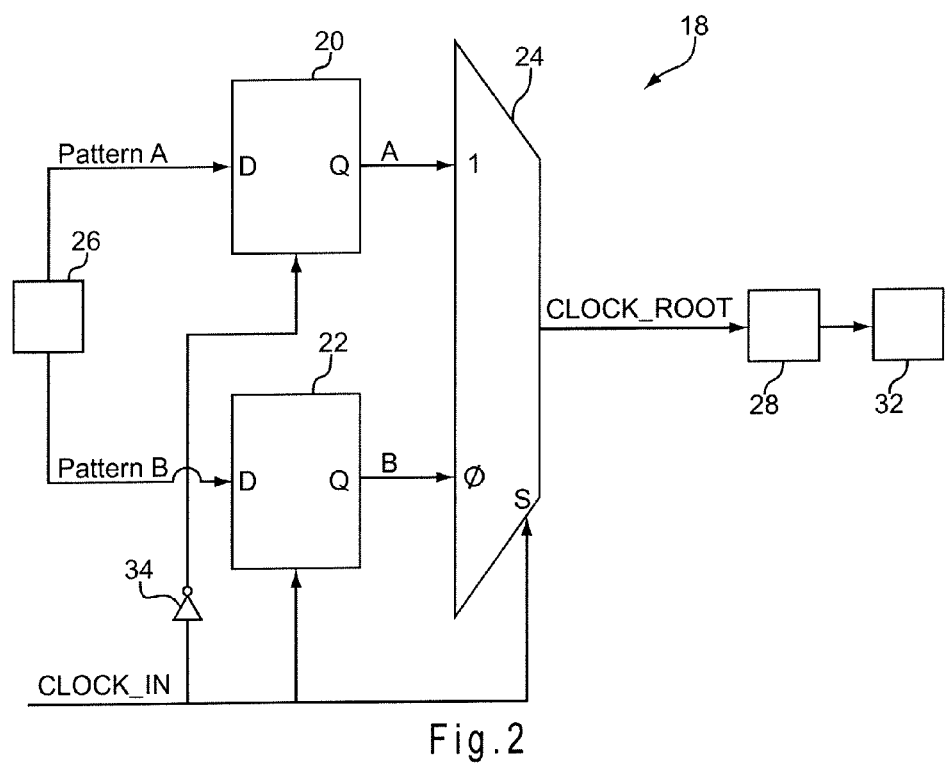
FIG. 2 is circuit diagram of a version of the clock signal generator shown in FIG. 1.

FIG. 2 is a circuit diagram of a system that includes an embodiment of a clock signal generator 18 of the present invention. In this embodiment, a pattern selector includes a first storage element 20 that receives the Pattern A signal, and a second storage element 22 that receives the Pattern B signal. The first and second storage elements 20, 22 may be D flip-flops, as an example. In alternate versions, the first and second storage elements 20, 22 may be another type of flip-flop, memory element, latch, register, or combination of flip-flops, latches, registers or other storage elements.

In the embodiment of FIG. 2, the first storage element 20 receives an inverted CLOCK_IN signal (through an inverter 34) and the second storage element 22 receives an un-inverted CLOCK_IN signal. The first and second storage elements 20, 22 receive the Pattern A and Pattern B signals at their respective inputs (D) and latch at their respective outputs (Q) the state of the pattern input signals at alternating transitions of the CLOCK_IN signal. Consequently, the output signals from the first and second storage elements 20, 22, referenced as signals A and B in FIG. 2, are synchronized to the CLOCK_IN signal. Because the first and second storage elements 20, 22 synchronize the Pattern A and Pattern B signals to the CLOCK_IN signal, the pattern generator 26 does not need to provide Pattern A and Pattern B signals under narrow timing constraints, i.e., the Pattern A and Pattern B signals may be "relaxed" signals.

The pattern selector of FIG. 2 includes a switching element 24 (such as a multiplexer) that receives at channel inputs the A and B signals from the first and second storage elements 20, 22, and outputs the generated clock signal, referred to as CLOCK_ROOT. The configuration of the CLOCK_ROOT signal is dependent upon the state of the A and B signals and transitions in the CLOCK_IN signal received at a selector input ("S"). When the CLOCK_IN signal at the selector input transitions high, the current state of the A signal is selected and output from the switching element 24. When the CLOCK_IN signal transitions low, the current state of the B signal is selected and output from the switching element 24. The switching element 24 requires the A and B signals to be stable at "1" or "0" for a set-up time prior to transitions in the CLOCK_IN signal and stable for a hold-time after transitions in the CLOCK_IN signal. In a preferred version of a multiplexer (discussed below), the set-up time is approximately 90 picoseconds and the hold-time is approximately 70 picoseconds.

In an embodiment, switching element 24 outputs a CLOCK_ROOT signal at an output pin. The CLOCK_ROOT signal is balanced relative to the CLOCK_IN signal, i.e., there is a constant and uniform delay between transitions in the CLOCK_IN signal at S and transitions in the CLOCK_ROOT signal at the output pin of the switching element 24. Due to the slope in the CLOCK_IN signal and the slope in the CLOCK_ROOT signal, the delay may be measured from mid-point to mid-point between the transitions.

The CLOCK_ROOT signal is communicated to the clock input pin of a device 32. The device 32 may be any device, memory, component, system, or circuit that is on a chip, for example, or other device that receives a clock signal. A clock buffer 28 may optionally be included as a part of the clock signal generator 18 or between the clock signal generator 18 and the device 32 to provide signal strength to the CLOCK_ROOT signal and/or to provide test signals for debugging circuit components.

Figure 3:
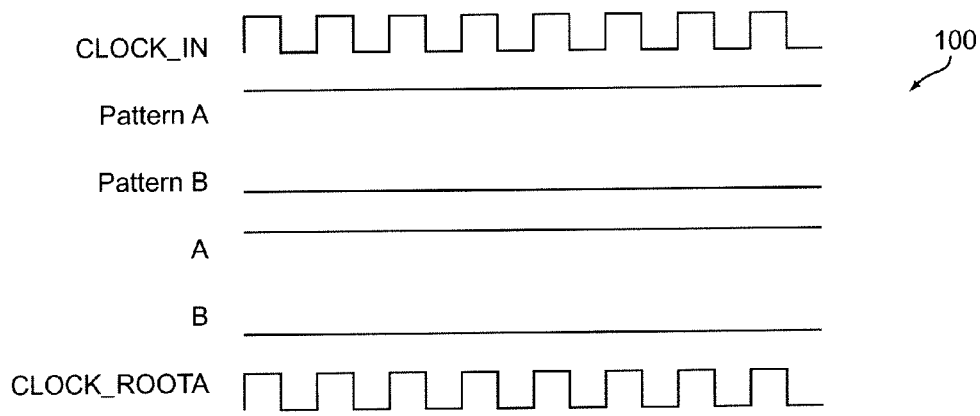
FIG. 3 is a timing diagram of the circuit of FIG. 2 showing input patterns for generating a clock output signal in a 1:1 ratio to a reference clock.

FIG. 3 is a timing diagram 100 of the clock signal generator 18 of FIG. 2. The timing diagram 100 shows Pattern A and Pattern B signals for generating a CLOCK_ROOTA signal in a 1:1 ratio to the CLOCK_IN signal. The CLOCK_ROOTA signal has a fifty-percent duty cycle. In this example, the Pattern A signal is continuously high, and the Pattern B signal is continuously low. Consequently, the outputs (A and B) of the first and second storage elements 20, 22 are continuously high and low, respectively. As a result, the switching element 24 outputs signal A (high) at each rising edge of CLOCK_IN, and outputs signal B (low) at each falling edge of CLOCK_IN. The resultant output is the CLOCK_ROOTA signal shown in FIG. 3. The CLOCK_ROOTA signal maintains the fifty-percent duty cycle of the CLOCK_IN signal because there is an equal delay for both rising transitions and falling transitions between the CLOCK_IN signal at S to the CLOCK_ROOTA signal at the output pin of the switching element 24.

Figure 4:
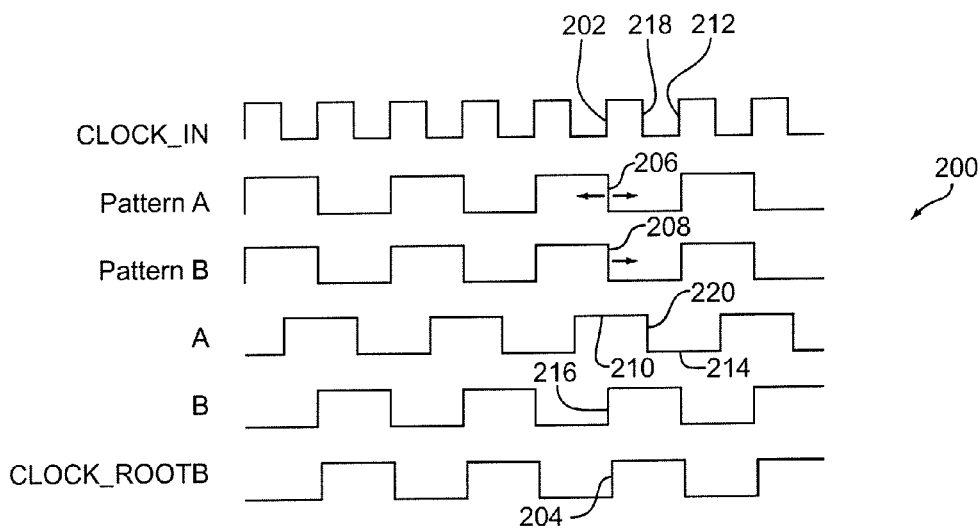
FIG. 4 is a timing diagram of the circuit of FIG. 2 showing input patterns for generating a clock output signal in a 1:2 ratio to a reference clock.

FIG. 4 is a timing diagram 200 of the clock signal generator of FIG. 2 showing Pattern A and Pattern B signals for generating a CLOCK_ROOTB signal in a 1:2 ratio to the CLOCK_IN signal. The CLOCK_ROOTB signal has a fifty-percent duty cycle. In this example, the Pattern A and Pattern B signals are identical and in a 1:2 ratio to the CLOCK_IN signal. The outputs (A and B) of the first and second storage elements 20, 22 may be delayed relative to Pattern A and Pattern B as a result of being passed through the flip-flops, for example. However, the A and B signals are synchronized to the CLOCK_IN signal, as shown, due to the first storage element 20 and the second storage element 22 being clocked by the CLOCK_IN signal. The rising edge of signal A is aligned with the falling edge of CLOCK_IN. The rising edge of signal B is aligned with the rising edge of CLOCK_IN. The resultant CLOCK_ROOTB signal is in a 1:2 ratio to the CLOCK_IN signal.

FIG. 4 illustrates that the CLOCK_ROOTB signal is also phase-aligned to the CLOCK_IN signal. For example, the rising edge 204 of the CLOCK_ROOTB signal occurs within a narrow margin of time to the rising edge 202 of the CLOCK_IN signal. The high level of accuracy is due to having the switching element 24, and therefore the CLOCK_ROOTB signal, triggered by CLOCK_IN. It is noteworthy that the switching element 24 is the only source of skew between the CLOCK_ROOTB and CLOCK_IN signals. The amount of skew between the CLOCK_ROOT signal and the CLOCK_IN signal will be consistent for any type of CLOCK_ROOT signal that may be generated by a circuit having the configuration shown in FIG. 2.

Figure 5:
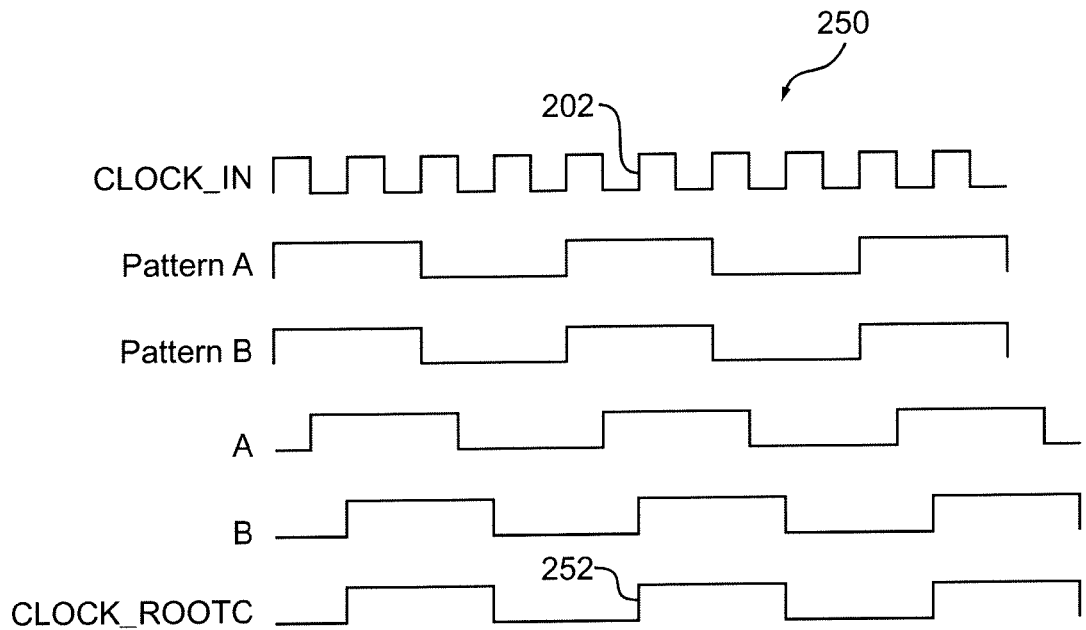
FIG. 5 is a timing diagram of the circuit of FIG. 2 showing input patterns for generating a clock output signal in a 1:4 ratio to a reference clock.

FIG. 5 is a timing diagram 250 of the clock signal generator 18 of FIG. 2 showing Pattern A and Pattern B signals for generating a CLOCK_ROOTC signal in a 1:4 ratio to the CLOCK_IN signal. The CLOCK_ROOTC signal has a fifty-percent duty cycle. In FIG. 5, note that only signal A (and hence Pattern A) is determinate of the transitions in the CLOCK_ROOTC signal, i.e., when CLOCK_IN transitions from a low state ("0") to a high state ("1"), the CLOCK_ROOTC signal transitions to or remains in the state shown in signal A. Signal B is structured so that it does not cause any transitions in the CLOCK_ROOTC signal when CLOCK_IN transitions from a high state to a low state.

FIGS. 4 and 5 show exemplary CLOCK_ROOT signals that have different ratios to the CLOCK_IN signal but are phase-aligned to one another by virtue of their being phase-aligned to the same CLOCK_IN signal. The rising edge 252 of CLOCK_ROOTC and the rising edge 204 of CLOCK_ROOTB are both phase-aligned to transition 202 in the CLOCK_IN signal. Because both CLOCK_ROOTB and CLOCK_ROOTC are generated primarily by only their respective switching elements, any skew from the CLOCK_IN signal to the CLOCK_ROOTB signal will be matched by skew from the CLOCK_IN signal to the CLOCK_ROOTC signal. It is noted that a circuit that implements both the CLOCK_ROOTB and CLOCK_ROOTC signals (and their respective pattern signals) will function synchronously because they implement identical clock signal generator circuits that are triggered by same CLOCK_IN signal.

Figure 6:
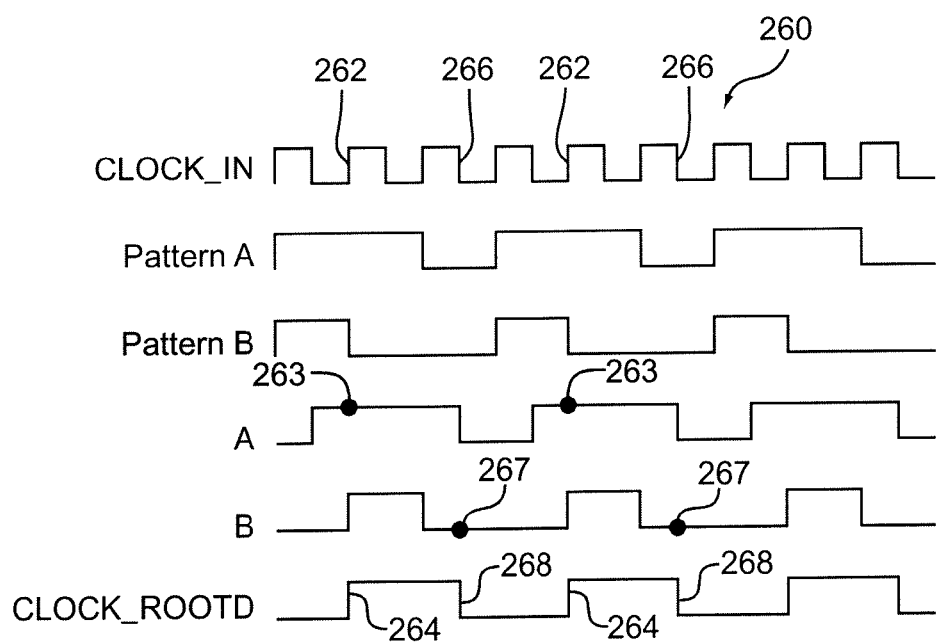
FIG. 6 is a timing diagram of the circuit of FIG. 2 showing input patterns for generating a clock output signal in a 1:3 ratio to a reference clock.

FIGS. 6 and 7 show additional examples of CLOCK_ROOT signals that may be generated by the clock signal generator 18. FIG. 6 is a timing diagram 260 showing Pattern A and Pattern B signals for generating a CLOCK_ROOTD signal at a ratio of 1:3 to the CLOCK_IN signal. The CLOCK_ROOTD signal has as fifty-percent duty cycle. When the CLOCK_IN signal transitions up (0→1) 262, the CLOCK_ROOTD signal is determined by the state of signal A at 263. As shown, the CLOCK_ROOTD signal transitions up at 264 to follow signal A when the CLOCK_IN signal transitions up (0→1) 262. When the CLOCK_IN signal transitions down (1→0) 266, the CLOCK_ROOTD signal is determined by the state of signal B at 267. As shown, the CLOCK_ROOTD signal transitions down at 268 to follow signal B when the CLOCK_IN signal transitions down (1→0) 266.

FIG. 7 is a timing diagram 270 showing Pattern A and Pattern B signals for generating an asymmetric CLOCK_ROOTE signal. The CLOCK_ROOTE signal is asymmetrical and thus the duty cycle of CLOCK_ROOTE is not fifty-percent. In FIG. 7, the high and low states of the CLOCK_ROOTE signal are not equal and vary in duration at different stages, however each of the transitions is phase-aligned to transitions in the CLOCK_IN signal. The "X" markers in signal A and signal B in FIG. 7 show the locations where the CLOCK_IN signal transitions up or down. Comparing signals A and B to CLOCK_ROOTE shows an example where both signals A and B are required to produce the clock root (CLOCK_ROOTE) signal.

FIGS. 6 and 7 show examples where transitions in the CLOCK_ROOT signal follow both A and B signals. In contrast, FIGS. 4, and 5 show examples where transitions in the CLOCK_ROOT signal follow only signal A, i.e., signal B is structured so that it does not interfere with the CLOCK_ROOT signal being generated by signal A.

FIG. 7 illustrates that the Pattern A and Pattern B signals may change if the device or circuit receiving the signals requires a different CLOCK_ROOT frequency. For example, the circuit driven by the CLOCK_ROOTE signal may transition into a low power mode or a testing mode, and then back to a functional mode. The Pattern A and Pattern B signals may be generated accordingly.

FIG. 7 also illustrates that the pattern generator 26 is not limited to generating uniform patterns having a fifty-percent duty cycle, for example, but may transition between patterns to generate a non-uniform CLOCK_ROOT signal having transitions that are synchronized to transitions in the CLOCK_IN signal. For example, the pattern generator 26 may generate a first set of patterns to drive a circuit with a clock root signal in a fully functional mode, and may transition to a second set of patterns to drive the circuit with a clock root signal in a power saving mode. The pattern generator 14, 26 may also change its patterns for testing or debugging a circuit, or for any other purpose. The pattern generator 14, 26 may receive control signals from a controller (not shown) for initiating, modifying, transitioning, terminating, or changing the patterns in accord with any mode of operation.

Whatever asymmetric or varying shape the CLOCK_ROOTE signal may be, it is ultimately determined by the Pattern A and Pattern B signals, just as for the CLOCK_ROOT signals of FIGS. 3-6. FIGS. 3-7 all illustrate that when the CLOCK_IN signal is high, the switching element 24 outputs the state of signal A, and when the CLOCK_IN signal is low, the switching element 24 outputs the state of signal B. Signals A and B are dependent on Pattern A and Pattern B and the function of any intervening devices, such as the storage elements 20, 22.

As discussed above, the structure of the CLOCK_ROOT signal, for example its ratio to the CLOCK_IN signal, is determined by the Pattern A and Pattern B signals, referred to again as the "patterns." The patterns may be derived through an algorithm, computer program, or any other technique. For example, the patterns may be derived by first deriving output signals A and B of the first and second storage elements 20, 22 that are required to provide the desired CLOCK_ROOT signal. This technique is described below.

Referring again to FIG. 4, signals A and B can be derived from CLOCK_ROOTB (the desired signal) and CLOCK_IN by noting the state of signals A and B at each clock transition of CLOCK_IN required to produced the desired CLOCK_ROOTB signal. The required state of signal A is determined when CLOCK_IN transitions high, and the required state of signal B is determined when CLOCK_IN transitions low. For example, at transition 202, a rising edge of CLOCK_IN, CLOCK_ROOTB=A. Therefore, to obtain the desired CLOCK_ROOTB signal, signal A (210) must be high at 202. At transition 212, the next rising edge of CLOCK_IN, CLOCK_ROOTB transitions low; therefore at transition 212 signal A (214) must be low. Outlines of both signals A and B are obtained using this technique until repeating patterns are observed, from which the full signals (A and B) may be derived.

Next, Pattern A and Pattern B as necessary to generate signals A and B are derived taking into account skewing introduced by storage elements 20, 22, for example. An outline of Pattern A can be derived with reference to signal A at each falling edge of CLOCK_IN, and an outline of Pattern B can be derived with reference to signal B at each rising edge of CLOCK_IN. For example, at transition 202 the data input of the second storage element 22 is latched at B. Because B (216) is high at 202, Pattern B (208) must be high at 202. Outlines of the Pattern A and Pattern B signals are obtained using this technique until repeating patterns are observed, from which the full signals (Pattern A and Pattern B) may be derived. It is noted that in some embodiments, the Pattern A and Pattern B signals may be logical compliments of each other (e.g., as a result of inversion by inverter circuitry or any other suitable circuitry) for generating a desired CLOCK_ROOT signal. For example, the Pattern A and Pattern B signals may each have a frequency that is approximately one-half of the CLOCK_IN signal frequency. In this case, Pattern B may be a delayed logical compliment of Pattern A (e.g., as a result of an inverter circuitry).

A version of a Verilog HDL program that derives the transition points of Pattern A and Pattern B signals for a desired CLOCK_ROOT signal is provided in the appendix of the present disclosure.

Once obtained, in an embodiment the Pattern A and Pattern B signals are generated to that they may be synchronized to either a rising transition or a falling transition of the CLOCK_IN signal. The patterns are input into the storage elements 20, 22 within a window of time with respect to the CLOCK_IN signal that also governs the output of the storage elements 20, 22. The window of time may be equal to one CLOCK_IN clock cycle minus the setup and hold times. In other words, the transitions of Pattern A and Pattern B do not need to occur precisely as shown in FIGS. 4-7 with respect to the CLOCK_IN signal. For example, in FIG. 4 because the outputs of storage elements 20, 22 are governed by the CLOCK_IN signal, transition 206 may occur one-half clock cycle (of CLOCK_IN) earlier or later than shown. The one-half clock cycle margin (provided that set-up and hold constraints are met for Pattern A and Pattern B) makes certain that Pattern A is low when CLOCK_IN goes low at 218 to latch a low state at A (220). For Pattern B, transition 208 may occur up to, but less than, one clock cycle later than shown. The one clock cycle margin provides that Pattern B is high when CLOCK_IN goes high at 202 to latch a high state at B (216). Because the timing margins for Pattern A and Pattern B are relatively broad, the timing requirements of the pattern generator 26 may be relaxed. Therefore, the pattern generator 26 may be implemented by a broad range of hardware, software, or firmware devices, as examples.

In an alternate version, the Pattern A and Pattern B signals are generated so that they may be synchronized to either a rising transition or a falling transition of the CLOCK_IN signal. In this version, the switching element 24 may receive the Pattern A and Pattern B signals directly, i.e., the storage elements 20, 22, are not required, and the set-up and hold times respectively of the Pattern A and Pattern B signals may be defined as a function of a timing input to switching element 24.

The CLOCK_IN signal may be generated by a device that is either internal or external to a circuit that implements the clock signal generator 18. Either internally or externally generated CLOCK_IN signals may be utilized in one or more of functional, testing, debug, or other modes, as explained below. The CLOCK_IN signal may be generated by an internal clock, such as a reference clock oscillator driven PLL. Typically, an internally driven CLOCK_IN signal is utilized when a circuit is operating in a fully functional mode. In a testing or debug mode, either an internal or external clock may generate the CLOCK_IN signal. By way of example, an external clock may generate the CLOCK_IN signal when a PLL driven CLOCK_IN signal is not desired, such as for certain DC scan testing modes. During DC scan testing, scan data is typically clocked into and out of a circuit at a clock rate that is much slower than the circuit's full operational speed. For DC scan testing, a much slower reference clock may be utilized to generate the CLOCK_IN signal.

The clock signal generator 18 may also support AC scan testing. During AC scan testing, the timing performance of a circuit is tested by driving the circuit with several CLOCK_IN signals generated by the PLL. Scan data is first clocked in at a rate that is much slower than the circuit's projected (full) operational speed. The circuit is then driven (stressed) by several full speed clock pulses. Data is then shifted out of the circuit at a rate that is again much slower than the projected operational speed. The PLL may generate the CLOCK_IN signal throughout the entire AC scan test, while the pattern generator 26 provides patterns to generate periods of slow and fast CLOCK_ROOT signals. Preferably, the patterns are designed so that the transitions from one clock speed to another occur while CLOCK_ROOT is low. One version of a Verilog HDL program for generating an AC scan test pattern is provided in the appendix of the present disclosure.

FIG. 8 is a flow chart showing acts 300 for generating a clock signal in accord with a version of the present invention. Pattern signals are generated (302) based on the desired clock signal. The pattern signals may be derived using an algorithm, computer program, or by any other method. A reference clock signal is generated (304) for synchronizing the clock signal. The clock signal is generated based on the pattern signals and transitions in the clock signal that are triggered by transitions in the reference clock signal (306). Other acts, not shown, may be implemented for generating the clock signal. For example, the pattern signals may be selected from a plurality of pattern signals. Additionally, the reference clock signal may be selected from a plurality of reference clock signals. Any of the steps, acts, methods, and/or actions discussed above with reference to FIGS. 1-7 may also be implemented for generating the clock signal, either in conjunction with or independent of the acts shown in FIG. 8.

Figure 9:
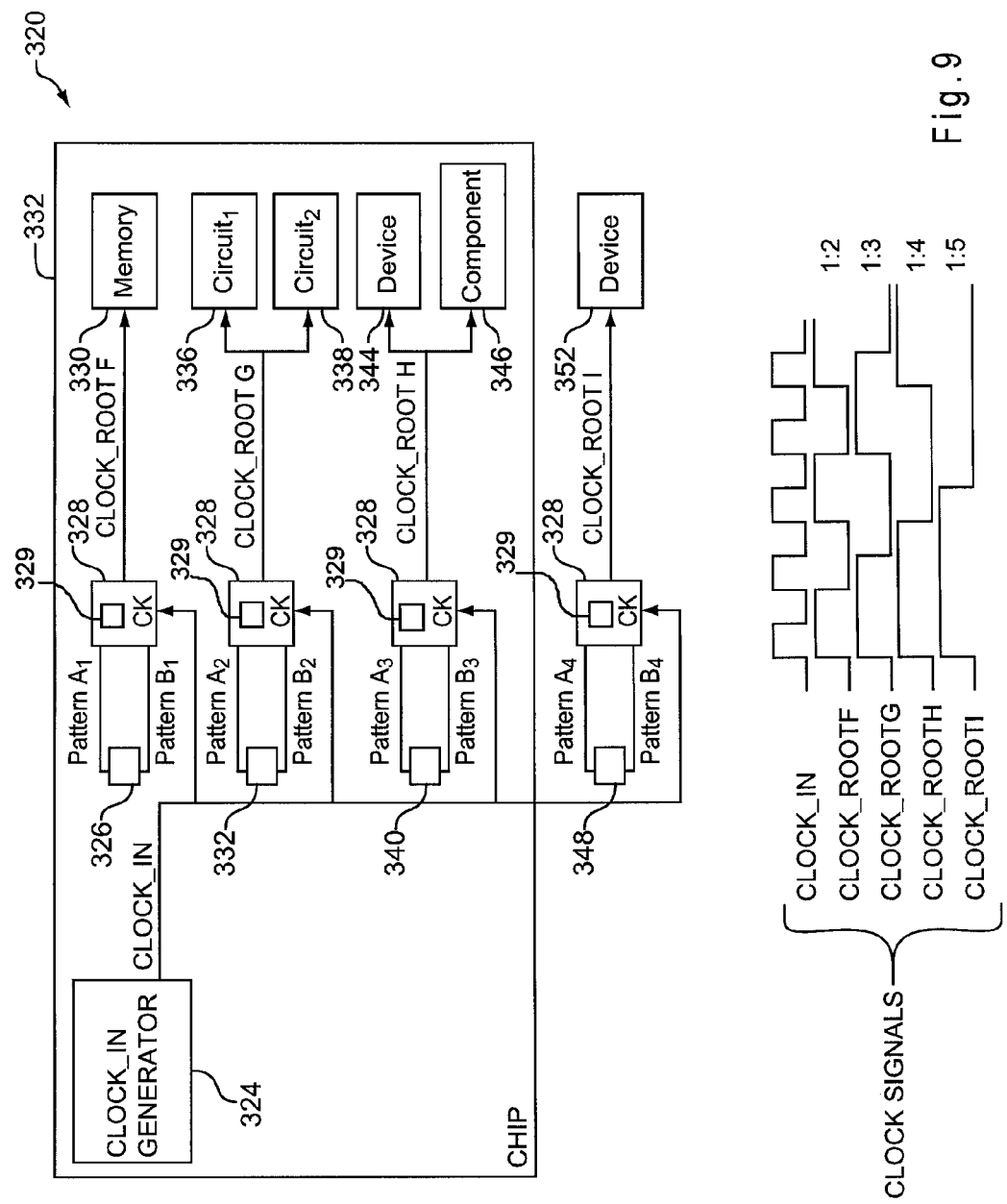
FIG. 9 is a block diagram showing illustrative circuitry for generating four clock signals, based on a reference clock signal, with different frequencies, each having a fifty-percent duty cycle, in accordance with embodiments of the invention.

FIG. 9 is a block diagram showing illustrative circuitry 320 for generating four clock signals CLOCK_ROOTF, CLOCK_ROOTG, CLOCK_ROOTH, and CLOCK_ROOTI based on a reference clock CLOCK_IN signal. The four clock signals are of different frequencies, each having a fifty-percent duty cycle, in accordance with embodiments of the invention. Part of circuitry 320 may be implemented on a chip 332 that includes CLOCK_IN GENERATOR circuitry 324 to generate the reference CLOCK_IN signal. The circuitry 320 may also include an off-chip root clock generator and module, as explained below.

The circuitry 320 includes four identical root clock generators 328 that receive the CLOCK_IN signal at input CK. Each root clock generator 328 may employ multiplexer circuitry 329 which uses the CLOCK_IN signal and clock defining data to output a respective CLOCK_ROOT signal that is related to the CLOCK_IN signal. The clock defining data may by a respective pair of low frequency clock patterns generated by respective pattern generators 326, 332, 340, and 348, as an example. The root clock generators 328 may be configured to output CLOCK_ROOT signals that have the following characteristics: a rise time that is equal to the rise time of the CLOCK_IN signal, a rise time which is equal to the fall time of the CLOCK_IN signal, a fall time which is equal to the rise time of the CLOCK_IN signal, and a fall time which is equal to the fall time of the CLOCK_IN signal.

Pattern generator 326 generates low frequency clock patterns Pattern $A_1$ and Pattern $B_1$ to generate the CLOCK_ROOTF signal. The CLOCK_ROOTF signal is a fifty-percent duty signal having a 1:2 ratio to the CLOCK_IN signal. Pattern generator 332 generates low frequency clock patterns Pattern $A_2$ and Pattern $B_2$ to generate the CLOCK_ROOTG signal. The CLOCK_ROOTG signal is a fifty-percent duty signal having a 1:3 ratio to the CLOCK_IN signal. Pattern generator 340 generates low frequency clock patterns Pattern $A_3$ and Pattern $B_3$ to generate the CLOCK_ROOTH signal. The CLOCK_ROOTH signal is a fifty-percent duty signal having a 1:4 ratio to the CLOCK_IN signal. Pattern generator 348 generates low frequency clock patterns Pattern $A_4$ and Pattern $B_4$ to generate the CLOCK_ROOTI signal. The CLOCK_ROOTI signal is a fifty-percent duty signal having a 1:5 ratio to the CLOCK_IN signal. Because the root clock generators 328 are identical, the skews between each CLOCK_ROOT signal and the CLOCK_IN signal are consistent, and the CLOCK_ROOT signals are substantially in mutual phase alignment.

Each CLOCK_ROOT signal CLOCK_ROOTF, CLOCK_ROOTG, CLOCK_ROOTH, and CLOCK_ROOTI is communicated to one or more respective modules, including memory 330, circuit$_1$ 336, circuit$_2$ 338, device 344, component 346, and device 352, as shown. The phase-alignment of the CLOCK_ROOT signals can advantageously facilitate timing and operation of synchronous electrical systems, for example by facilitating adherence to various timing constraints, such as those imposed by setup and hold times required by various modules.

Referring again to FIG. 2, it is noted that the clock signal generator 18 may implement any type of switching element 24 either now known or later developed. In one version, the switching element 24 is a time-balanced multiplexer circuit. As used herein, "time-balanced multiplexer circuitry" is defined as multiplexer circuitry operable to receive a plurality of data inputs and at least one selector input, and to generate a data output, where the multiplexer circuit is configured in a way that all transitions of the at least one selector input (e.g., high-to-low and low-to-high transitions) will result in substantially equal delays before the corresponding transitions of the data output. In other words, the time between a transition on the selector input and the corresponding transition on the data output will remain substantially constant in time-balanced multiplexer circuitry regardless of which transition (e.g., high-to-low and low-to-high) has occurred at the selector input. For example, the delay between a rising edge of the CLOCK_IN signal and a corresponding rising edge of the generated CLOCK_ROOT signal can be substantially equal to the time that elapses between a falling edge of the CLOCK_IN signal and a corresponding falling edge of the generated CLOCK_ROOT signal. Such duty-cycle characteristics can advantageously facilitate proper timing of electrical systems and modules, especially in systems that rely on DDR (double data rate) timing. The use of the time-balanced multiplexer circuitry can provide clock signals of substantially different frequencies with low duty-cycle distortion and phase alignment that are substantially immune to variations in process, voltage, and temperature.

Figure 10:
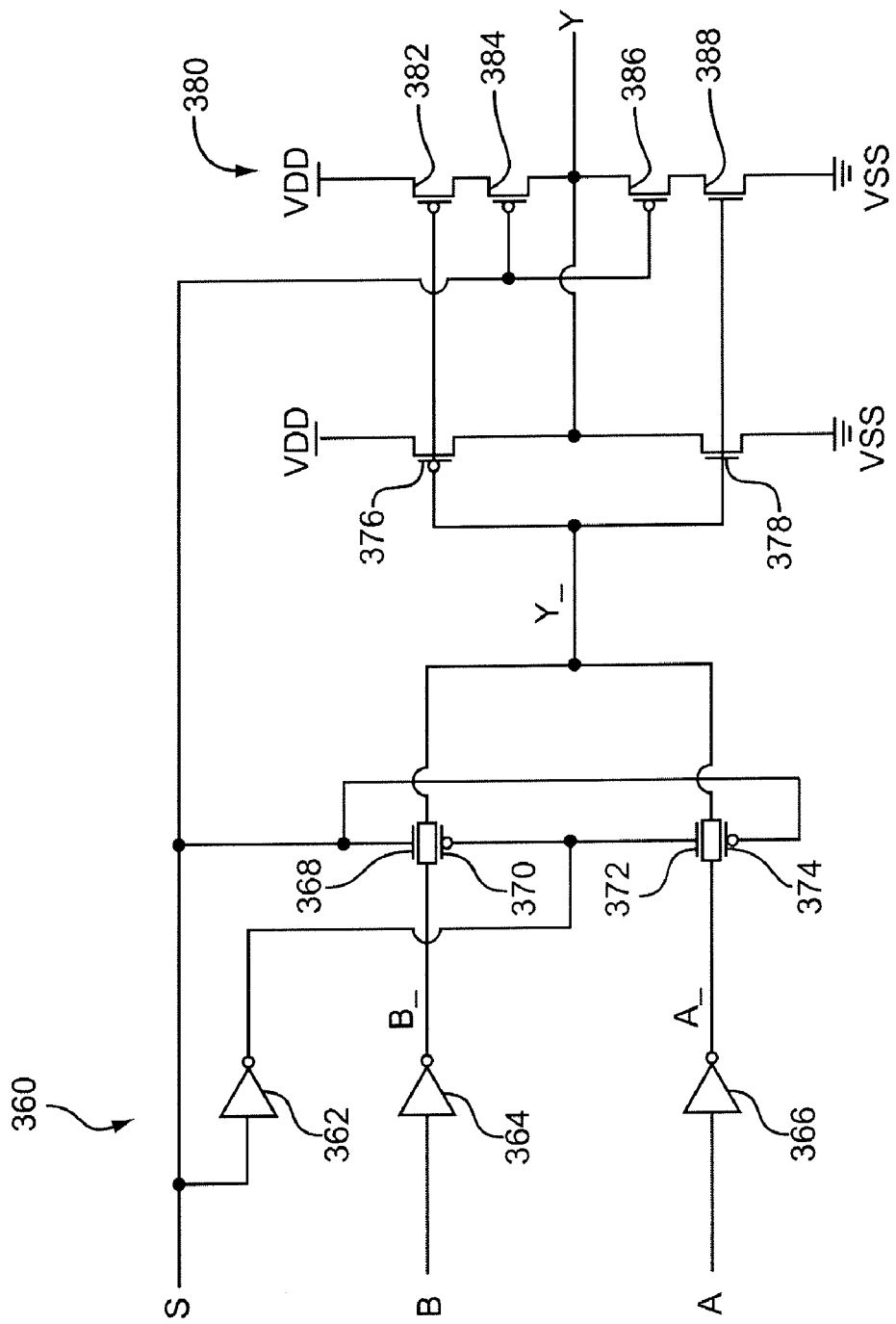
FIG. 10 is a circuit diagram showing an illustrative time-balanced multiplexer circuit for use in a clock signal generator in accordance with embodiments of the invention.

FIG. 10 is a circuit diagram showing illustrative time-balanced multiplexer circuitry 360 in accordance with embodiments of the invention. Time-balanced multiplexer circuitry 360 can be used as switching element 24 of FIG. 2. Time-balanced multiplexer circuitry 360 can include inverter circuitry 362, 364, and 366, N-type metal oxide semiconductor ("NMOS") transistors 368, 372, and 378, and P-type meal oxide semiconductor ("PMOS") transistors 370, 374, and 376. Time-balanced multiplexer circuit 360 can be configured to pass the logical value of data input A to data output Y when selector input S is a logical 0. Likewise, time-balanced multiplexer circuit 360 can be configured to pass output Y when selector input S is a logical 1. It is noted that the value of data inputs A and B should be valid for a sufficient amount of time before and after selector input S undergoes a transition, in order to satisfy setup and hold-time constraints.

Time-balanced multiplexer circuit 360 can also include additional transistor chain 380, which can include PMOS transistors 382 and 384, as well as NMOS transistors 386 and 388. The gates of transistors 382 and 388 can be coupled to signal Y, while the gates of transistors 384 and 386 can be coupled to selector input S. Transistor chain 380 can serve to delay relatively fast transitions, such that the switching of time-balanced multiplexer circuit 360 is substantially balanced with respect to transitions of selector input S. Further details regarding the structure and operation of time-balanced multiplexer circuitry 360 can be found in U.S. patent application Ser. No. 11/093,080, filed Mar. 28, 2005, which is hereby incorporated by reference herein. It is noted that time-balanced multiplexer circuitry 360 is merely illustrative, and other time-balanced multiplexer circuitry can be used as switching element 24 in FIG. 2, or elsewhere in connection with embodiments of the invention.

Figure 11A:
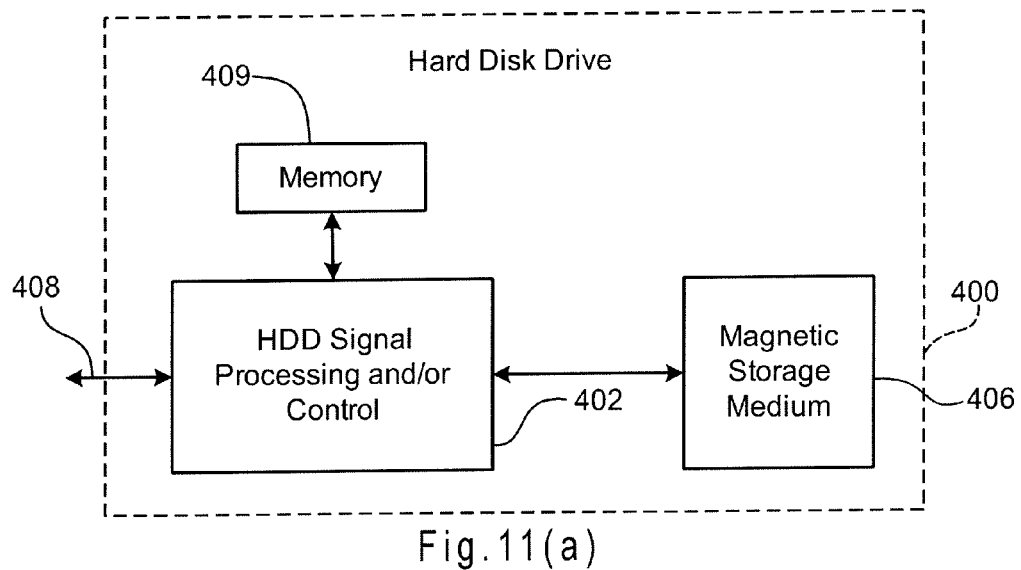
FIG. 11(*a*) is a functional block diagram of a hard disk drive.

Referring now to FIGS. 11(a) to 11(h), various exemplary implementations of the present invention are shown. Referring to FIG. 11(a), the present invention may be embodied in a hard disk drive (HDD) 400. HDD 400 may communicate with a host device (not shown) such as a computer, mobile computing devices such as personal digital assistants, cellular phones, media or MP3 players and the like, and/or other devices via one or more wired or wireless communication links 408.

The present invention may be implemented with either or both signal processing and/or control circuits, which are generally identified in FIG. 11(a) at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406. HDD 400 may be connected to memory 409, such as random access memory (RAM), a low latency nonvolatile memory such as flash memory, read only memory (ROM) and/or other suitable electronic data storage. One or more clock signal generator circuits (not shown) of the present invention may be implemented in either or both of signal processing and/or control circuit 402 and memory 409.

Figure 11B:
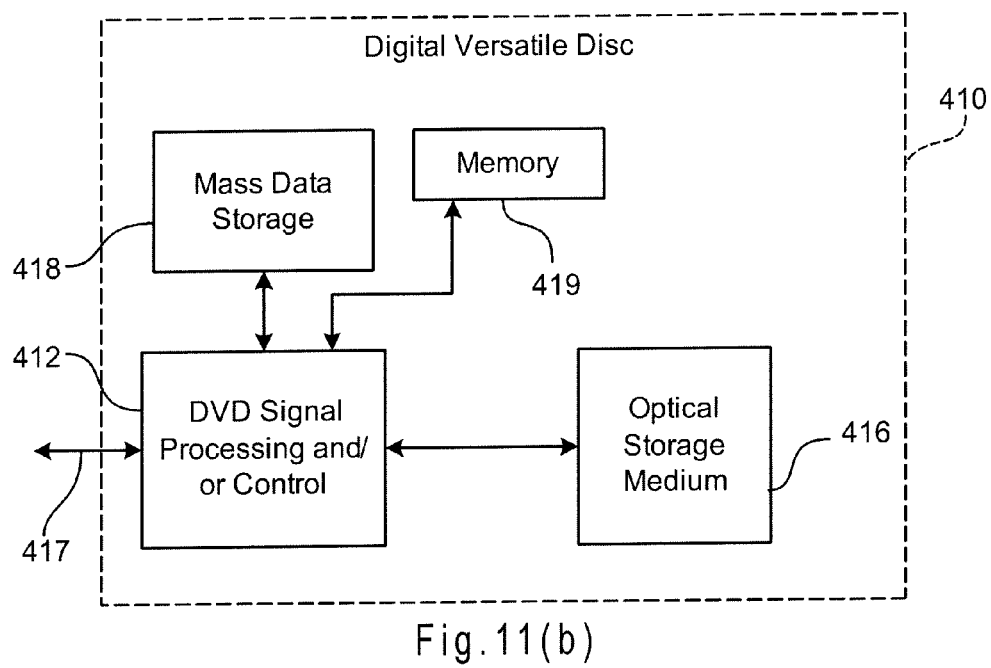

Referring now to FIG. 11(b), the present invention may be implemented in a digital versatile disc (DVD) drive 410. The present invention may be implemented in either or both signal processing and/or control circuits, which are generally identified in FIG. 11(b) at 412, and/or mass data storage 418 of DVD drive 410. Signal processing and/or control circuit 412 and/or other circuits (not shown) in DVD drive 410 may process data, perform coding and/or encryption, perform calculations, and/or format data that is read from and/or data written to an optical storage medium 416. In some implementations, signal processing and/or control circuit 412 and/or other circuits (not shown) in DVD drive 410 can also perform other functions such as encoding and/or decoding and/or any other signal processing functions associated with a DVD drive.

DVD drive 410 may communicate with a device (not shown) such as a computer, television or other device via one or more wired or wireless communication links 417. DVD drive 410 may communicate with mass data storage 418 that stores data in a nonvolatile manner. Mass data storage 418 may include a HDD such as that shown in FIG. 11(a). The HDD may be a mini HDD that includes one or more platters having a diameter that is smaller than approximately 1.8". DVD drive 410 may be connected to memory 419, such as RAM, ROM, low latency nonvolatile memory such as flash memory, and/or other suitable electronic data storage. One or more clock signal generator circuits (not shown) of the present invention may be implemented in one or more of signal processing and/or control circuit 412, memory 419, and mass data storage 418.

Figure 11C:
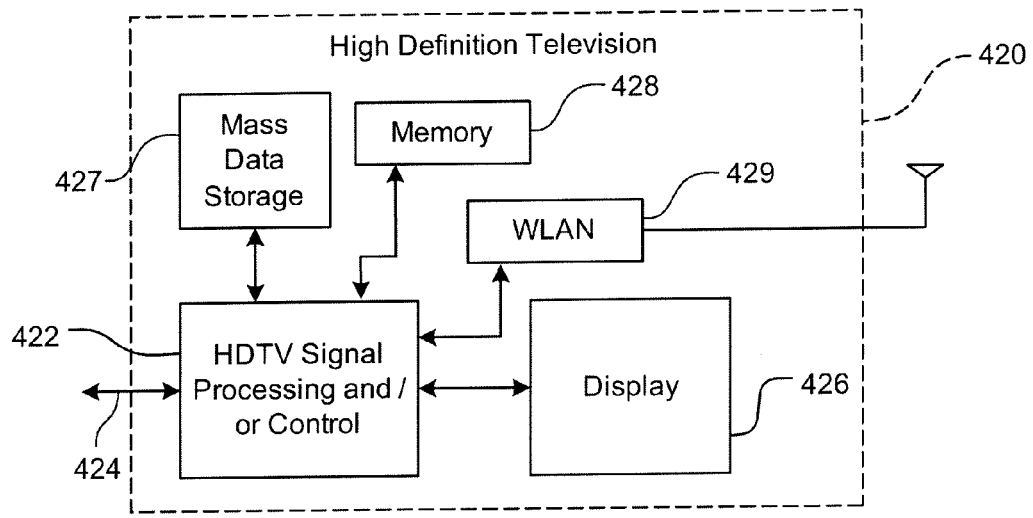

Referring now to FIG. 11(c) the present invention may be embodied in a high definition television (HDTV) 420. The present invention may be implemented in either or both signal processing and/or control circuits, which are generally identified in FIG. 11(c) at 422, a WLAN interface 429 and/or mass data storage 427 of the HDTV 420. HDTV 420 may receive HDTV input signals in either a wired or wireless format via one or more wired or wireless communication links 424 and generate HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. At least one HDD may have the configuration shown in either FIG. 11(a) and/or at least one DVD may have the configuration shown in FIG. 11(b). The HDD may be a mini HDD that includes one or more platters having a diameter that is smaller than approximately 1.8". HDTV 420 may be connected to memory 428 such as RAM, ROM, low latency nonvolatile memory such as flash memory and/or other suitable electronic data storage. HDTV 420 also may support connections with a WLAN via a WLAN network interface 429. One or more clock signal generator circuits (not shown) of the present invention may be implemented in one or more of signal processing and/or control circuit 422, memory 428, mass data storage 427, display 426, and WLAN 429.

Figure 11D:
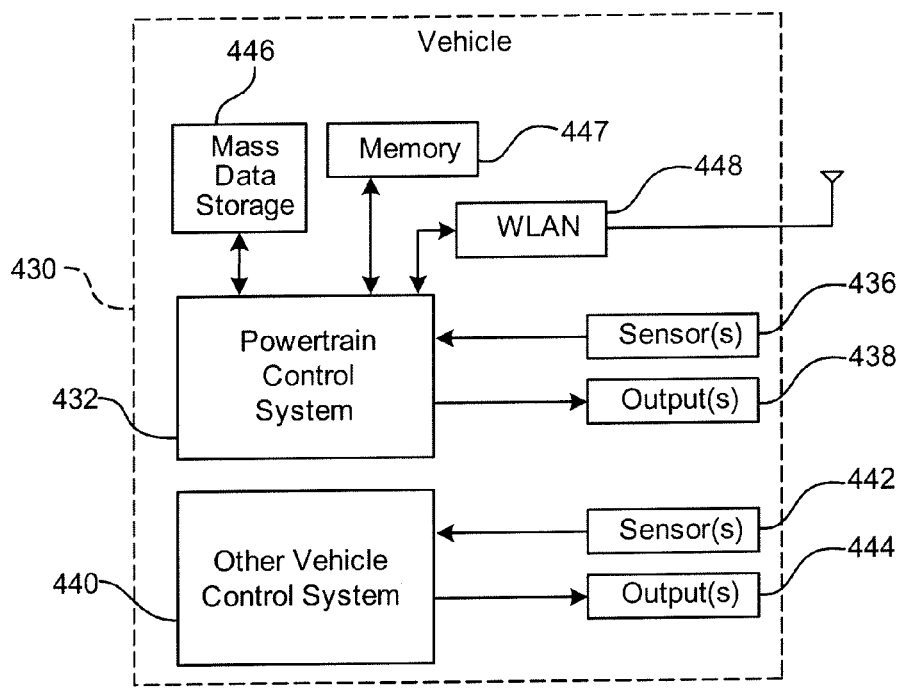

Referring now to FIG. 11(d), the present invention may be implemented in a control system of a vehicle 430, a WLAN interface 448 and/or mass data storage 446 of the vehicle control system. In some implementations, the present invention is implemented in a power-train control system 432 that receives inputs from one or more sensors 436 such as temperature sensors, pressure sensors, rotational sensors, airflow sensors and/or any other suitable sensors and/or that generates one or more output control signals such as engine operating parameters, transmission operating parameters, and/or other control signals at one or more output(s) 438.

The present invention may also be embodied in other control systems 440 of vehicle 430. Control system 440 may likewise receive signals from input sensors 442 and/or output control signals to one or more output(s) 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices, for example HDDs and/or DVDs. At least one HDD may have the configuration shown in FIG. 11(a) and/or at least one DVD may have the configuration shown in FIG. 11(b). The HDD may be a mini HDD that includes one or more platters having a diameter that is smaller than approximately 1.8". Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown). One or more clock signal generator circuits (not shown) of the present invention may be implemented in one or more of powertrain control system 432, memory 447, mass data storage 446, WLAN 448, other vehicle control system 440, sensor 436, sensor 442, output 438, and output 444.

Figure 11E:
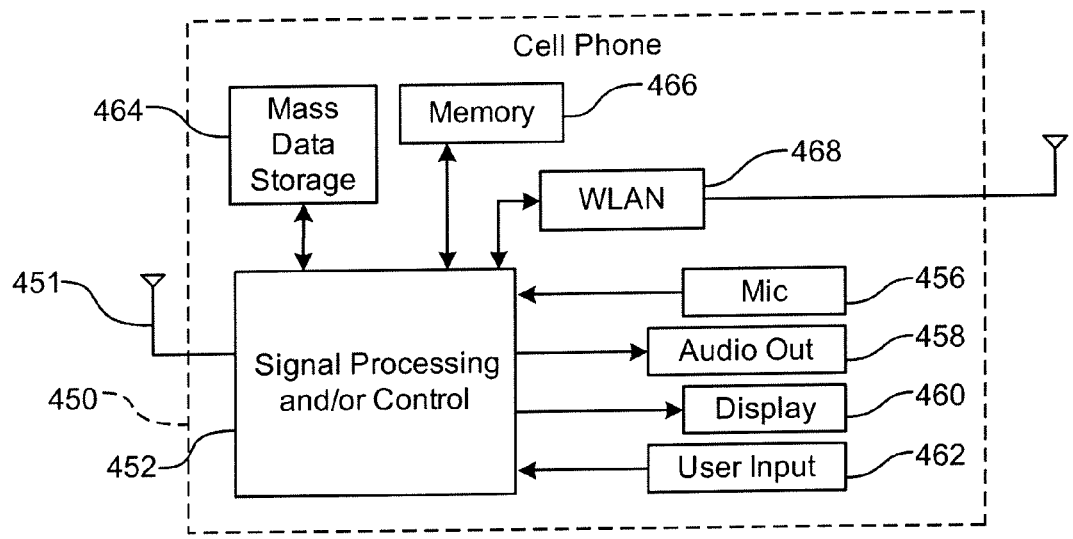

Referring now to FIG. 11(e), the present invention may be embodied in a cellular phone 450 that may include a cellular antenna 451. The present invention may be implemented in either or both signal processing and/or control circuits, which are generally identified in FIG. 11(e) at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with mass data storage 464 that stores data in a nonvolatile manner such as optical and/or magnetic storage devices, for example HDDs and/or DVDs. At least one HDD may have a configuration shown in FIG. 11(a) and/or at least one DVD may have the configuration shown in FIG. 11(b). The HDD may be a mini HDD that includes one or more platters having a diameter that is smaller than approximately 1.8". Cellular phone 450 may be connected to memory 466 such as RAM, ROM, low latency nonvolatile memory such as flash memory and/or other suitable electronic data storage. Cellular phone 450 also may support connections with a WLAN via a WLAN network interface 468. One or more clock signal generator circuits (not shown) of the present invention may be implemented in one or more of signal processing and/or control circuit 452, memory 466, mass data storage 464, WLAN 468, display 460, and user input 462.

Figure 11F:
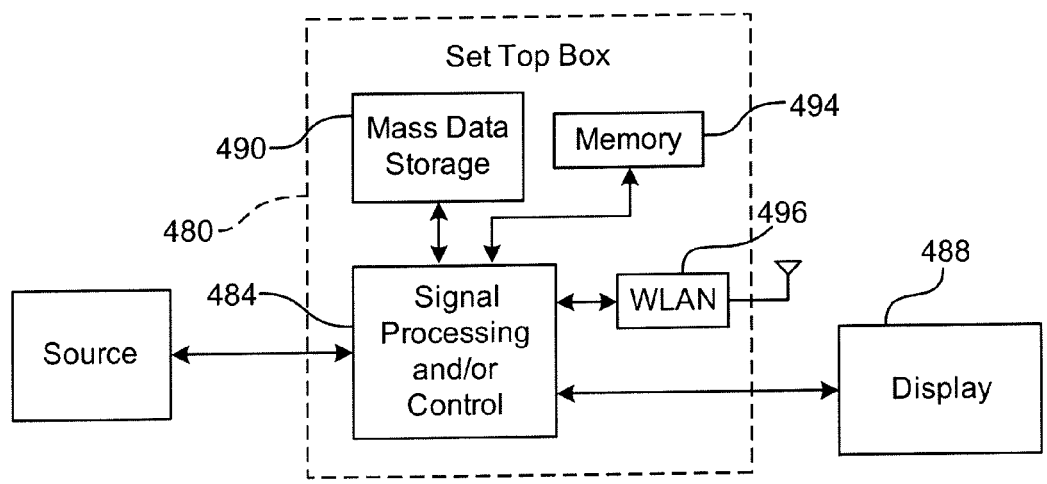

Referring now to FIG. 11(f), the present invention may be embodied in a set top box 480. The present invention may be implemented in either or both signal processing and/or control circuits, which are generally identified in FIG. 11(f) at 484, a WLAN interface and/or mass data storage of the set top box 480. Set top box 480 receives signals from a source 498 such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices, for example HDDs and/or DVDs. At least one HDD may have a configuration shown in FIG. 11(a) and/or at least one DVD may have the configuration shown in FIG. 11(b). The HDD may be a mini HDD that includes one or more platters having a diameter that is smaller than approximately 1.8". Set top box 480 may be connected to memory 494 such as RAM, ROM, low latency nonvolatile memory such as flash memory and/or other suitable electronic data storage. Set top box 480 also may support connections with a WLAN via a WLAN network interface 496. One or more clock signal generator circuits (not shown) of the present invention may be implemented in one or more of signal processing and/or control circuit 484, memory 494, mass data storage 490, WLAN 496, and display 488.

Figure 11G:
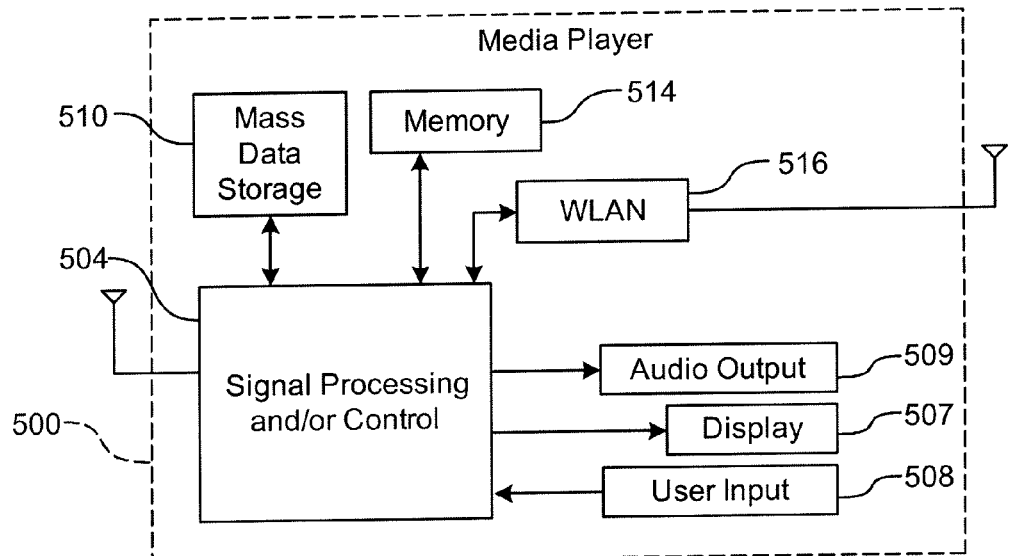

Referring now to FIG. 11(g), the present invention may be embodied in a media player 500. The present invention may be implemented in either or both signal processing and/or control circuits, which are generally identified in FIG. 11(g) at 504, a WLAN interface and/or mass data storage of the media player 500. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuits 504 and/or other circuits (not shown) of media player 500 may process data, perform coding and/or encryption, perform calculations, format data and/or perform any other media player function.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include optical and/or magnetic storage devices, for example HDDs and/or DVDs. At least one HDD may have a configuration shown in FIG. 11(a) and/or at least one DVD may have the configuration shown in FIG. 11(b). The HDD may be a mini HDD that includes one or more platters having a diameter that is smaller than approximately 1.8".

Media player 500 may be connected to memory 514 such as RAM, ROM, low latency nonvolatile memory such as flash memory and/or other suitable electronic data storage. Media player 500 also may support connections with a WLAN via a WLAN network interface 516. Still other implementations in addition to those described above are contemplated. One or more clock signal generator circuits (not shown) of the present invention may be implemented in one or more of signal processing and/or control circuit 504, memory 514, mass data storage 510, WLAN 516, audio output 509, display 507, and user input 508.

Figure 11H:
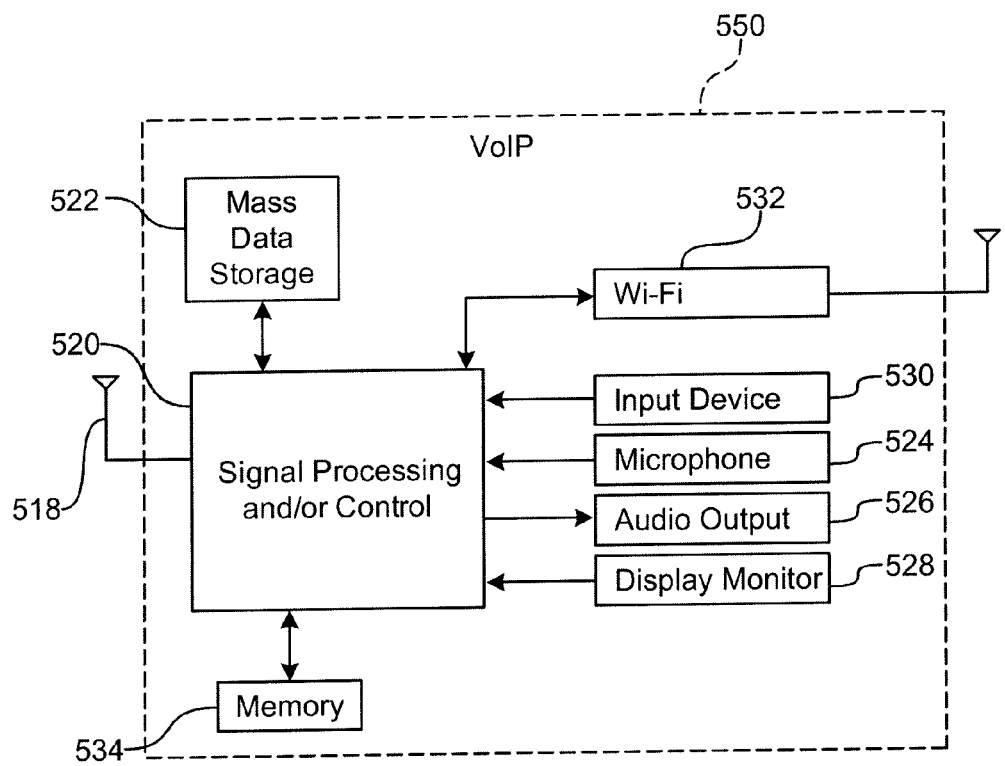

Referring to FIG. 11(h), the present invention may be embodied in a Voice over Internet Protocol (VoIP) phone 550 that may include an antenna 518. The present invention may be implemented in either or both signal processing and/or control circuits, which are generally identified in FIG. 11(h) at 520, a wireless interface and/or mass data storage of the VoIP phone 550. In some implementations, VoIP phone 550 includes, in part, a microphone 524, an audio output 526 such as a speaker and/or audio output jack, a display monitor 528, an input device 530 such as a keypad, pointing device, voice actuation and/or other input devices, and a Wi-Fi communication module 532. Signal processing and/or control circuits 520 and/or other circuits (not shown) in VoIP phone 550 may process data, perform coding and/or encryption, perform calculations, format data and/or perform other VoIP phone functions.

VoIP phone 550 may communicate with mass data storage 522 that stores data in a nonvolatile manner such as optical and/or magnetic storage devices, for example HDDs and/or DVDs. At least one HDD may have a configuration shown in FIG. 11(a) and/or at least one DVD may have the configuration shown in FIG. 11(b). The HDD may be a mini HDD that includes one or more platters having a diameter that is smaller than approximately 1.8". VoIP phone 550 may be connected to memory 534, which may be a RAM, ROM, low latency nonvolatile memory such as flash memory and/or other suitable electronic data storage. VoIP phone 550 is conFIG.d to establish communications link with a VoIP network (not shown) via Wi-Fi communication module 532. One or more clock signal generator circuits (not shown) of the present invention may be implemented in one or more of signal processing and/or control circuit 520, memory 534, mass data storage 522, Wi-Fi 532, input device 530, microphone 524, audio output 526, and display monitor 528.

In addition to the above exemplary implementations, the present invention may be implemented in any synchronous very-large-scale integrated (VLSI) circuit or application specific integrated circuit (ASIC) design including central processing units, controllers, switches, network devices, cellular chips, and others.

All of the discussion above, regardless of the particular implementation being described, is exemplary in nature, rather than limiting. Although specific components of the clock signal generator (10 and 18) are described, methods, systems, and articles of manufacture consistent with the clock signal generator (10 and 18) may include additional or different components. For example, components of the clock signal generator (10 and 18) may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the clock signal generator (10 and 18) may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the invention can take and not as a definition of the invention. It is only the following claims, including all equivalents, that are intended to define the scope of this invention.

APPENDIX

Verilog program to derive transition points for a desired CLOCK_ROOT:
// Convert incoming config to count/transition points
// Config values are binary N for ratio 1:N
// cfg_clkdiv is the binary N denominator
//----------------------------------------
// Max Count
wire [CNT_SIZE −1:0] max_cnt   = cfg_clkdiv − {{CNT_SZM1 {1'b0}},1'b1} ;
// Toggle Base - define toggle up and down position of the positive and negative patterns:
wire [CNT_SIZE−1:0] pos_tog_mid = {1'b0,cfg_clkdiv[CNT_SIZE −

APPENDIX-continued

```
1:1]} ;
wire [CNT_SIZE-1:0] neg_tog_mid_pre =
{1'b0,cfg_clkdiv[CNT_SIZE-1:1]} +
{{CNT_SZM1 {1'b0}},cfg_clkdiv[0]} ;
// Counters
wire pos_reload = (~|pos_cnt) | (FORCE_EXT_RATIO &
load_ext_ratio) ; // load at zero.
wire pos_toggle_mid = (~|(pos_cnt^pos_tog_mid));
wire pos_toggle_end = (~|pos_cnt);
wire neg_toggle_mid = (~|(neg_tog_mid_pre^pos_cnt));
wire neg_toggle_end= pos_toggle_end;
wire [CNT_SIZE-1:0] pos_cnt_nxt = pos_reload ? max_cnt :
(pos_cnt −
{{CNT_SZM1 {1'b0}},1'b1});
always @ (posedge clk_in or negedge pll_rst_)
if (~pll_rst_) pos_cnt <= #('cpu_ff_delay) {CNT_SIZE{1'b0}} ;
else if (cnt_en) pos_cnt <= #('cpu_ff_delay) pos_cnt_nxt ;
wire ratio_1to1 = ~|(cfg_clkdiv ^ {{CNT_SZM1 {1'b0}},1'b1});
wire pos_pat_nxt = ratio_1to1 | (pos_toggle_mid ? 1'b0 :
pos_toggle_end ? 1'b1 : pos_pat) ;
wire neg_pat_nxt =~ratio_1to1 & (neg_toggle_mid ? 1'b0 :
neg_toggle_end ? 1'b1 : neg_pat) ;
always @ (posedge clk_in or negedge pll_rst_)
if (~pll_rst_) pos_pat <= #('cpu_ff_delay) {1'b1};
else pos_pat <= #('cpu_ff_delay) pos_pat_nxt ;
always @ (posedge clk_in or negedge pll_rst_)
if (~pll_rst_) neg_pat <= #('cpu_ff_delay) {1'b0} ;
else neg_pat <= #('cpu_ff_delay) neg_pat_nxt ;
Verilog program for generating AC scan test pattern:
// SCAN_CLOCK serving the scan_clock_from_pad* is at least 8 times
slower than the fast clock
parameter AC_IDLE = 2'b00 ; // idle. exit when shift is detected low.
parameter AC_STDB = 2'b01 ; // standby. wait for scanclock to go low
so the transitions are quiet. Load Counter
parameter AC_CAPT = 2'b11 ; // Activate the capture procedure as
long as CNT is on and according to clock type
parameter AC_DONE = 2'b10 ; // wait for shift to be detected on and
then goto AC_IDLE.
always @(ac_scan_mode or scan_shift_1d or ac_scan_ps or cnt_done
or cnt_dec)
case (ac_scan_ps)
AC_IDLE: ac_scan_ns = (ac_scan_mode & ~scan_shift_1d) ?
AC_STDB : AC_IDLE ;
// init the flow if ac_scan and deassertion of SHIFT is detected
AC_STDB: ac_scan_ns = (cnt_dec) ? AC_CAPT : AC_STDB ;
// goto capture/stress mode when target clock is LOW
AC_CAPT: ac_scan_ns = (cnt_done) ? AC_DONE : AC_CAPT ;
AC_DONE: ac_scan_ns = (scan_shift_id) ? AC_IDLE : AC_DONE ;
default: ac_scan_ns = {2{1'bx}};
endcase
always @(posedge clk_in or negedge pll_rst_)
if ( ~pll_rst_ ) ac_scan_ps <= #('cpu_ff_delay) AC_IDLE ;
else ac_scan_ps <= #('cpu_ff_delay) ac_scan_ns;
//----------------------
wire load_ac_scan_cnt = ~ac_scan_ps[1];
wire [2:0] ac_cnt_m1 = ac_cnt − 3'd1 ;
wire [2:0] ac_cnt_nxt = load_ac_scan_cnt ? ac_scan_cnt :
(cnt_dec) ? ac_cnt_m1 : ac_cnt;
// When out of capture zone - load the max value
// Otherwise:
// if clk_1to1 - do not pass to external pattern. Use local counter.
// if not clk_1to1 - use falling edge detect of the pos_pattern
wire ac_cnt_en = (~|(ac_scan_ps^AC_STDB)) |
(~|(ac_scan_ps^AC_CAPT)) & cnt_dec;
always @ (posedge clk_in) if (ac_cnt_en) ac_cnt <= #('cpu_ff_delay)
ac_cnt_nxt;
//----------------------
// Final Patterns:
wire sel_scantest = scantest & ~ac_scan_mode ;
//
assign ac_pos_pattern = sel_scantest |      // 1'b1 in scantest
(~|(ac_scan_ps^AC_IDLE)) & scan_clk_sync3 ; // sel
reference pattern
if in idle
// AC_STDB and AC_DONE and CAPT :- 1'b0
//----------------------
assign ac_neg_pattern = ~sel_scantest &    // 1'b0 in scantest
(~|(ac_scan_ps^AC_IDLE)) & scan_clk_sync3 ;
// AC_STDB and AC_DONE and AC_CAPT are all Zero.
assign ac_scan_pat_select = sel_scantest |
ac_scan_mode & (
(~|(ac_scan_ps^AC_IDLE)) |
(~|(ac_scan_ps^AC_STDB)) & ~cnt_dec |
(~|(ac_scan_ps^AC_CAPT)) & ~(ac_cnt[2] | ac_cnt[1] | ac_cnt[0] &
~cnt_dec) |
(~|(ac_scan_ps^AC_DONE))
);
endmodule // ac_scan_fsm
```

What is claimed is:

1. An apparatus comprising:
a switching element including selector circuitry configured to receive a first clock signal that alternates between a high state and a low state, a first input signal, and a second input signal, and output a second clock signal having a first state that is determined by the first input signal when the first clock signal is low, and having a second state that is determined by the second input signal when the first clock signal is high, and further including additional time balanced circuitry that is configured to receive the second clock signal and to change a rate of transition in the second clock signal responsively to the first clock signal to output a time balanced second clock signal.

2. The apparatus of claim 1 further comprising a first storage element to communicate the first input signal to the switching element, wherein the first storage element is clocked by the first clock signal.

3. The apparatus of claim 2 wherein the first storage element is a memory element that receives a low pattern signal.

4. The apparatus of claim 2 further comprising a second storage element to communicate the second input signal to the switching element, wherein the second storage element is clocked by the first clock signal.

5. The apparatus of claim 4 wherein the second storage element is a memory element that receives a high pattern signal.

6. The apparatus of claim 1 wherein the switching element is a multiplexer.

7. The apparatus of claim 1 further comprising a signal generator to generate the first and second input signals to provide the second clock signal, wherein consecutive periods of the first state are equal.

8. The apparatus of claim 1 further comprising a signal generator to generate the first and second input signals to provide the second clock signal, wherein a period of the second clock signal is an integer multiple of a period of the first clock signal.

9. A method comprising:
receiving a first clock signal that alternates between a high state and a low state, a first input signal, and a second input signal, and responsively generating
a second clock signal having a first state that is determined by the first input signal when the first clock signal is low, and having a second state that is determined by the second input signal when the first clock signal is high; and
generating a time balanced second clock signal by changing a rate of transition in the second clock signal responsively to the first clock signal.

10. The method of claim 9 further comprising communicating the first input signal to a switching element in accord with the first clock signal.

11. The method of claim 10 further comprising communicating a low pattern signal to a first storage element in communication with the switching element.

12. The method of claim 10 further comprising communicating the second input signal to the switching element in accord with the first clock signal.

13. The method of claim 10 further comprising communicating a high pattern signal to a second storage element in communication with the switching element.

14. The method of claim 9 further comprising synchronizing transitions in the second clock signal to transitions in the first clock signal.

15. The method of claim 9 further comprising generating the first and second input signals to provide the second clock signal, wherein consecutive periods of the first state are equal.

16. The method of claim 9 further comprising generating the first and second input signals to provide the second clock signal, wherein a period of the second clock signal is an integer multiple of a period of the first clock signal.

17. A system comprising:
a reference clock outputting a reference clock signal having a first frequency;
a first clock signal generating circuitry that receives the reference clock signal, and that employs first multiplexer circuitry which uses the reference clock signal and first clock defining data to output a first output signal that is aligned to the reference clock signal;
a second clock signal generating circuitry that receives the reference clock signal, and that employs second multiplexer circuitry which uses the reference clock signal and second clock defining data to output a second output signal that is aligned to the reference clock signal and has a different frequency than the first output signal;
a first device to receive the first output signal at a first device clock input; and
a second device to receive the second output signal at a second device clock input.

18. The system of claim 17 wherein both the first and second multiplexer circuitries are configured to output the respective first and second output signals, both having the following characteristics: a rise time that is substantially equal to a reference clock signal rise time and a reference clock signal fall time, and a fall time that is substantially equal to the reference clock signal rise time and the reference clock signal fall time.

19. The system of claim 17 wherein the first output signal and the second output signal are substantially in mutual phase alignment.

20. A method comprising:
generating a first clock signal based on a reference clock signal and first clock defining data, wherein the first clock signal is aligned to the reference clock signal;
generating a second clock signal based on the reference clock signal and second clock defining data, wherein the second clock signal has a different frequency than the first clock signal, and wherein the second clock signal is aligned to the reference clock signal;
communicating the first clock signal to a first device; and
communicating the second clock signal to a second device.

21. The method of claim 20 wherein the first and second clock signals both have the following characteristics: a rise time that is substantially equal to a reference clock signal rise time and a reference clock signal fall time, and a fall time that is substantially equal to the reference clock signal rise time and the reference clock signal fall time.

22. The method of claim 20 wherein the first clock signal and the second clock signal are substantially in mutual phase alignment.

23. An apparatus comprising:
a first storage element having a first input to receive a first signal pattern;
a second storage element having a second input to receive a second signal pattern;
a switching element to receive a first output of the first storage element and a second output of the second storage element, wherein the first storage element, the second storage element, and the switching element are clocked by a first clock signal, and the switching element outputs a second clock signal; and
time balanced circuitry that is configured to receive the second clock signal and change a rate of transition in the second clock signal responsively to the first clock signal to generate a time balanced second clock signal.

24. The apparatus of claim 23 comprising a pattern generator to generate the first signal pattern and the second signal pattern, and wherein the pattern generator modifies the first and second signal patterns to modify the second clock signal.

25. The apparatus of claim 23 wherein a ratio of the first clock signal to the second clock signal is based on the first and second signal patterns.

* * * * *